(12) United States Patent
Mizutani et al.

(10) Patent No.: US 9,134,363 B2
(45) Date of Patent: Sep. 15, 2015

(54) OPERATION CHECK SUPPORT DEVICE AND OPERATION CHECK SUPPORT METHOD

(71) Applicant: PANASONIC CORPORATION, Osaka (JP)

(72) Inventors: Kenji Mizutani, Kyoto (JP); Nobuyuki Otsuka, Kyoto (JP)

(73) Assignee: Panasonic Corporation, Osaka (JP)

( * ) Notice: Subject to any disclaimer, the term of this patent is extended or adjusted under 35 U.S.C. 154(b) by 224 days.

(21) Appl. No.: 13/927,158

(22) Filed: Jun. 26, 2013

(65) Prior Publication Data
US 2013/0289923 A1    Oct. 31, 2013

Related U.S. Application Data

(63) Continuation of application No. PCT/JP2012/005945, filed on Sep. 19, 2012.

(30) Foreign Application Priority Data

Oct. 3, 2011    (JP) ................................ 2011-219000
Oct. 4, 2011    (JP) ................................ 2011-219744

(51) Int. Cl.
*G01R 19/00*    (2006.01)
*G01R 31/28*    (2006.01)

(52) U.S. Cl.
CPC .......... *G01R 31/282* (2013.01); *G01R 31/2806* (2013.01); *G01R 31/2843* (2013.01); *G01R 31/2848* (2013.01)

(58) Field of Classification Search
CPC .. G01R 31/28; G01R 31/282; G01R 31/2891; G01R 1/06794; G01R 1/06788; G01R 1/40; G01R 13/0236; G01R 13/208; G01R 17/02; G01R 31/2848; G01R 31/2843
USPC ................................................... 702/117, 71
See application file for complete search history.

(56) References Cited

U.S. PATENT DOCUMENTS 4,484,329 A * 11/1984 Slamka et al. ................. 714/734
4,510,572 A *  4/1985 Reece et al. ................... 714/732
(Continued)

FOREIGN PATENT DOCUMENTS

JP    08-190421    7/1996
JP    11-237446    8/1999
(Continued)

OTHER PUBLICATIONS

International Search Report issued Oct. 23, 2012 in International (PCT) Application No. PCT/JP2012/005945.
(Continued)

*Primary Examiner* — Timothy H Hwang
(74) *Attorney, Agent, or Firm* — Wenderoth, Lind & Ponack, L.L.P.

(57) ABSTRACT

A device that supports an operator in checking an operation of an electronic circuit mounted on a board includes the following units. A waveform obtainment unit obtains a measured waveform as a signal waveform of a voltage or current measured by the operator bringing a probe into contact with the board. A similarity calculation unit calculates a similarity between the measured waveform and each of simulated signal waveforms which are signal waveforms of a voltage or current at respective nodes on the electronic circuit and are obtained by simulating the operation of the electronic circuit. A position determination unit determines, based on node information indicating positions of the nodes, a node position on the electronic circuit which corresponds to a simulated signal waveform having a maximum similarity. A notification unit notifies the operator of the node position determined on the electronic circuit.

13 Claims, 25 Drawing Sheets

(56) References Cited

U.S. PATENT DOCUMENTS

| | | | | |
|---|---|---|---|---|
| 5,043,910 | A | * | 8/1991 | Chiba .......................... 716/136 |
| 5,051,938 | A | * | 9/1991 | Hyduke .......................... 703/15 |
| 5,596,283 | A | * | 1/1997 | Mellitz et al. ............ 324/750.22 |
| 2006/0155396 | A1 | * | 7/2006 | Jeserer ........................... 700/56 |
| 2007/0093999 | A1 | * | 4/2007 | Birmiwal et al. ............... 703/14 |
| 2007/0179731 | A1 | * | 8/2007 | Suri et al. ...................... 702/117 |
| 2011/0018548 | A1 | * | 1/2011 | Tsubamoto ................... 324/537 |
| 2011/0316555 | A1 | * | 12/2011 | Liang et al. ................... 324/543 |
| 2012/0203500 | A1 | * | 8/2012 | Ma et al. ....................... 702/150 |

FOREIGN PATENT DOCUMENTS

| | | |
|---|---|---|
| JP | 2005-121595 | 5/2005 |
| JP | 2006-258672 | 9/2006 |

OTHER PUBLICATIONS

L. W. Nagel et al., "SPICE (Simulation Program with Integrated Circuit Emphasis)", Memorandum No. ERL-M382, University of California, Berkeley, Apr. 12, 1973.

"Transistor Technology (Toranzista Gijutsu)" magazine, CQ Publishing Col, Ltd., Feb. 1993, with partial English Translation.

International Search Report issued Oct. 23, 2013 in International (PCT) Application No. PCT/JP2012/005945.

\* cited by examiner

```
R_R46       OUTPUT N1698050  18k
X_TR2       0 N1703891 N1785797 N1785823 CST1-100LB-CS_Tr
C_C16       N1652760 0  4.7u IC=0
R_R2        9 N1768496  470k
R_RLOAD     OUTPUT GND  2.4
R_R41       N1698050 N1698110  2.7k
R_R20       N1652536 0  330k
E_EAUX_O    N1740098 0 N1739958 ZERO 1
C_C21       N1657008 0  10n IC=0
C_C10       N1771799 0  4.7n IC=0.11378
R_R42       N1698050 GND  3.3k
R_R3        N1768496 N1768502  750k
C_E3        N1739966 ZERO  2.2u
V_Vac       N1751713 N1751549
+SIN 0 {110*1.414} 50 0 0 0
C_E1        9 0  150u IC=393
R_R33       14 0  2.2k
C_C25       0 GND  2.2n
D_D9        0 N1785797 DMMSD4148T1
C_C23       12 N1703891  33nF
X_L5        N1703745 11 IND-LLC-v1
D_D14B      N1698702 N1697794 Dmbrf20100ct_14b
C_E4        N1740344 0  47u IC=9
R_R7        N1772097 N1772153  470k
R_R6        N1771865 N1772097  2.2meg
R_R28       13 N1697802  100
X_FAUX_O1   N1740104 N1740054 8 0 SCHEMATIC1_FAUX_O1
C_E2        9 0  150u IC=393
R_R1        N1756007 0  0.1
R_R15       N1703901 N1703887  470k
```

1. Initialization Step

- Power Spectrum Envelope of Measured Waveform : $F\_r(f\_1), \ldots, F\_r(f\_m)$ ;
- Power Spectrum Envelope of Simulated Signal Waveform ;
    Generate array of a[0 to m][0 to n] for $F\_s(f\_1), \ldots, F\_s(f\_n)$ and set initial value
    a[i][0] = i ( i = 0~m)
    a[0][j] = j ( j = 0~n)

2. Calculation Step for i = 1 to m
 for j = 1 to n
  Set a[i][j] to minimum value among following three values 1. a[i-1][j-1]+ (|F\_r(f\_j) - F\_s(f\_j)| is ε or less → 0, exceeds ε → α)
  2. a[i-1][j]+1
  3. a[i][j-1]+1 next j
next i

3. Result Obtainment Step

Output value of 1/a[m][n] as similarity between measured waveform and simulated signal waveform FIG. 19
(a) 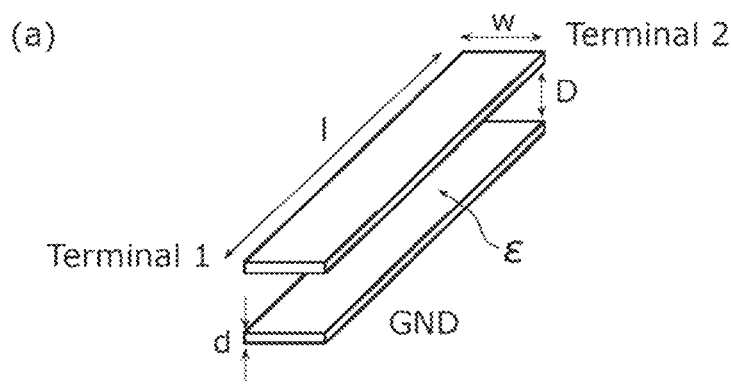
(b) 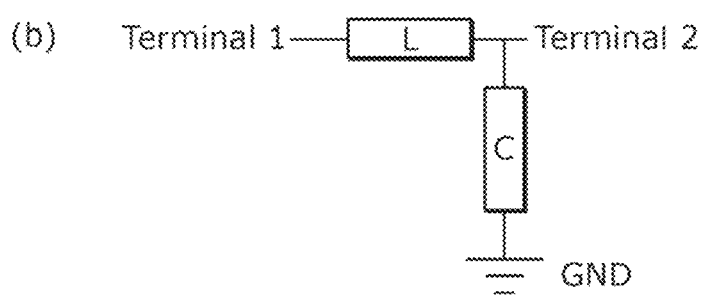
$$L[nH] = 0.2l(\ln \frac{2l}{w+d} + 0.2235 \frac{w+d}{l} + 0.5)$$
$$C[pF] = \varepsilon_0 \varepsilon \frac{wl}{D}$$

Measured Signal Profile

・Maximum and Minimum Values: +0.23[V], -0.21[V]
・Basic Cycle: 2.8e-5[s]

FIG. 24

1. Initialization Step

- Measured Waveform: $f_r(t_{r1}), ..., f_r(t_{rm})$
- Simulated Signal Waveform:
  Generate array of a[0 to m][0 to n] for $f_s(t_{s1}), ..., f_s(t_{sn})$ and set initial value a[i][0] = i (i = 0~m)
a[0][j] = j (j = 0~n)

2. Calculation Step for i = 1 to m
for j = 1 to n
Set a[i][j] to minimum value among following three values 1. value of a[i-1][j-1]+(|f_r(t_r_i) - f_s(t_s_j)| is ε or less → 0, exceeds ε → α)
2. a[i-1][j]+1
3. a[i][j-1]+1 next j
next i

3. Result Obtainment Step

Output value of 1/a[m][n] as similarity between measured waveform and simulated signal waveform

OPERATION CHECK SUPPORT DEVICE AND OPERATION CHECK SUPPORT METHOD

CROSS REFERENCE TO RELATED APPLICATIONS

This is a continuation application of PCT Patent Application. No. PCT/JP2012/005945 filed on Sep. 19, 2012, designating the United States of America, which is based on and claims priority of Japanese Patent Applications Nos. 2011-219000 filed on Oct. 3, 2011 and 2011-219744 filed on Oct. 4, 2011. The entire disclosures of the above-identified applications, including the specifications, drawings and claims are incorporated herein by reference in their entirety.

FIELD

One or more exemplary embodiments disclosed herein relate to operation check support devices and operation check support methods for supporting an operator in checking whether or not a print board circuit manufactured as a test production based on a circuit design operates according to design specification.

BACKGROUND

Patent Literature 1 discloses a system that visually presents previously-stored design specification and a point at which a voltage or a current is to be measured on a print circuit board (hereinafter, referred to as a "PCB").

CITATION LIST

Patent Literature

[Patent Literature 1] Japanese Unexamined Patent Application Publication No. 8-190421

SUMMARY

Technical Problem

However, in Patent Literature 1, a digital application circuit such as a logic circuit is mainly assumed as a target to be designed. In evaluating a PCB, standardized general-purpose test terminals such as a Joint Test Action Group (JTAG) can be easily used. Therefore, a preparation cost for test jigs is not a serious problem in a stage of test production.

However, all PCBs do not have test terminals. Even if the system disclosed in Patent Literature 1 is used, it is difficult to reduce a time required for measurement work. Furthermore, an operator sometimes measures a voltage or the like without noticing that he/she measures it at a wrong point, and he/she has to repeat the same measurement work.

One non-limiting and exemplary embodiment provides an operation check support device and an operation check support method which are capable of providing, as feedback, an operator with information regarding a currently-measuring circuit node to cause the operator to notice whether or not the circuit node is a target to be measured, at a time of starting probing the circuit node without causing the operator to check a measuring point by his/her eyes.

Solution to Problem

In one general aspect, the techniques disclosed here feature an operation check support device that supports an operator in checking an operation of an electronic circuit mounted on a board, the operation check support device comprising: a waveform obtainment unit configured to obtain a measured waveform that is a signal waveform of one of a voltage and a current, the measured waveform being measured by the operator bringing a probe into contact with the board; a similarity calculation unit configured to calculate a similarity between the measured waveform obtained by the waveform obtainment unit and each of simulated signal waveforms, the each of simulated signal waveforms being a signal waveform of one of a voltage and a current at a corresponding one of nodes on the electronic circuit, and the each of simulated signal waveforms being obtained by simulating the operation of the electronic circuit; a position determination unit configured to determine a position of a node among the nodes on the electronic circuit based on node information, the node corresponding to a simulated signal waveform having a maximum similarity calculated by the similarity calculation unit, the node information indicating positions of the nodes on the electronic circuit, and the nodes each corresponding to a corresponding one of the simulated signal waveforms; and a notification unit configured to notify the operator of the position of the node on the electronic circuit as determined by the position determination unit.

These general and specific aspects may be implemented using a system, a method, an integrated circuit, a computer program, or a computer-readable recording medium such as a CD-ROM, or any combination of systems, methods, integrated circuits, computer programs, or computer-readable recording media.

Advantageous Effects

One or more exemplary embodiments or features disclosed herein are capable of providing, as feedback, an operator with information regarding a currently-measuring circuit node to cause the operator to notice whether or not the circuit node is a target to be measured, at a time of starting probing the circuit node without causing the operator to check a measuring point by his/her eyes.

BRIEF DESCRIPTION OF DRAWINGS

These and other advantages and features will become apparent from the following description thereof taken in conjunction with the accompanying Drawings, by way of non-limiting examples of embodiments disclosed herein.

FIG. 5 is a diagram showing an example of a netlist representation of the circuit diagram stored in the circuit database according to Embodiment 1.

FIG. 12 is a diagram showing an algorithm of a dynamic programming method used by a similarity calculation unit according to Embodiment 1.

FIG. 19 is a diagram showing an example of parasitic components generated by a parasitic component addition unit according to Embodiment 3.

FIG. 24 shows an algorithm of a dynamic programming method used by a similarity calculation unit according to Embodiment 3.

DESCRIPTION OF EMBODIMENTS (Underlying Knowledge Forming Basis of the Present Disclosure)

With the advance of Electronics Design Automation (EDA) tools, it is currently general to electronically design layouts of electronic circuits and print circuit boards.

Checking whether or not an actual electronic circuit operates according to design specification needs various processes. More specifically, (i) a process of manufacturing, according to the design specification, a test PCB on which electronic parts are mounted, (ii) a process of switching ON the test PCB with the electronic parts, (iii) a process of measuring a voltage applied to a pin of each of the electronic parts in consideration of parasitic component for which copper foil of the PCB serves as inductance components and capacitance components, and comparing the measured pin voltage to a pin voltage indicated in the design specification.

In the early test stage for PCB, processes of test manufacturing, estimation, and design improvement is repeated many times. It is therefore impossible to afford a time and a cost for introducing automatic measurement tools. Therefore, an implementer or the like generally measures and compares voltages of respective pins of parts by his/her hands to evaluate a PCB. In order to reduce such work load, it has been attempt to sequentially present the implementer with design specification and a point to be measured on the PCB. For example, Patent Literature 1 discloses the system of visually presenting a previously-stored design specification and a point to be measured on the PCB.

Figure 1:
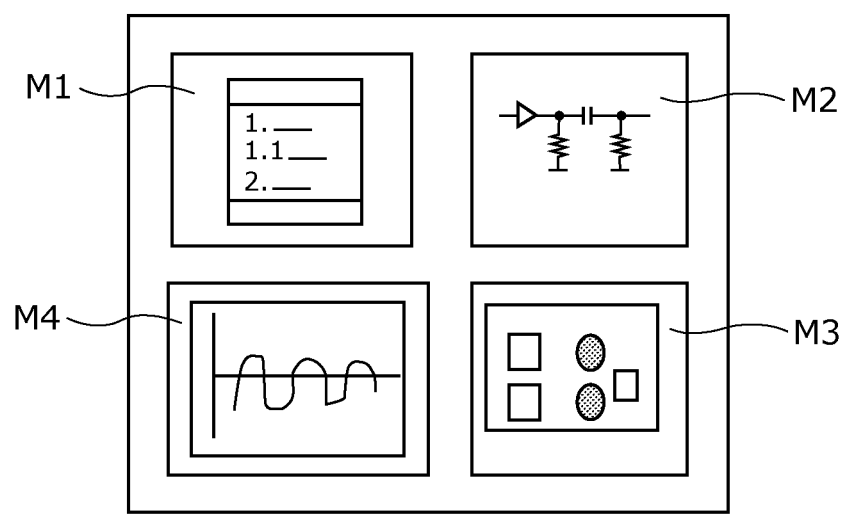
FIG. 1 is a diagram showing a general outline of an operation check support method disclosed in Patent Literature 1.

FIG. 1 shows an example of a display screen of a test terminal included in a system disclosed in Patent Literature 1. On the display screen of the test terminal, a test specification image M1, a circuit diagram M2, an implementation diagram M3, and a test result image M4 are displayed. An operator measures circuit signals shown in the circuit diagram M2 according to the measurement procedure shown in the test specification image M1. Here, the point where a signal is to be measured is displayed as highlighted in the PCB implementation diagram M3. The operator connects a test jig to the point on the PCB which corresponds to the point highlighted in the implementation diagram M3.

However, in Patent Literature 1, a digital application circuit such as a logic circuit is mainly assumed as a target to be designed. Therefore, in evaluating the PCB, it is possible to easily use a standardized general-purpose test terminal such as a JTAG. Therefore, a preparation cost for a test jig is not a serious problem in manufacturing the test PCB.

However, for power electronics application circuits having a large ratio of an analog circuit such as an AC/DC convertor, there is no standardized general-purpose test terminal. Therefore, the operator needs to check, by his/her eyes, the measuring point shown in the implementation diagram FIG. 3, and match a probe of an oscilloscope to the measuring point corresponding to the measured point on the PCB (hereinafter, the matching is referred to as "probing") and repeat the signal measurement by his/her hands.

A layout of a copper foil of PCB is generally in a complicated shape. If an implementation density of parts is higher, silk printing for clarifying the existence of the parts is less. Therefore, a recognition load for identifying the measuring part is huger. Therefore, in the earlier test manufacturing stage, even if the system disclosed in Patent Literature 1 is used, there is a difficulty in reducing a time for measurement work. Furthermore, stepping back to previous process in measurement work occurs due to measurement of a voltage or the like without noticing that a wrong position is measured.

One non-limiting and exemplary embodiment provides an operation check support device capable of providing, as feedback, an operator with information regarding a currently-measuring circuit node to cause the operator to notice whether or not the circuit node is a target to be measured, at a time of starting probing the circuit node without causing the operator to check a measuring point by eyes.

In one general aspect, the techniques disclosed here feature an operation check support device that supports an operator in checking an operation of an electronic circuit mounted on a board, the operation check support device comprising: a waveform obtainment unit configured to obtain a measured waveform that is a signal waveform of one of a voltage and a current, the measured waveform being measured by the operator bringing a probe into contact with the board; a similarity calculation unit configured to calculate a similarity between the measured waveform obtained by the waveform obtainment unit and each of simulated signal waveforms, the each of simulated signal waveforms being a signal waveform of one of a voltage and a current at a corresponding one of nodes on the electronic circuit, and the each of simulated signal waveforms being obtained by simulating the operation of the electronic circuit; a position determination unit configured to determine a position of a node among the nodes on the electronic circuit based on node information, the node corresponding to a simulated signal waveform having a maximum similarity calculated by the similarity calculation unit, the node information indicating positions of the nodes on the electronic circuit, and the nodes each corresponding to a corresponding one of the simulated signal waveforms; and a notification unit configured to notify the operator of the position of the node on the electronic circuit as determined by the position determination unit.

With the above structure, a simulated signal waveform that is the most similar to a measured waveform measured by the operator bringing the probe into contact with a target is determined, and a position of a node corresponding to the simulated signal waveform is determined on the electronic circuit. As a result, it is possible to providing, as feedback, the operator with information regarding a currently-measuring circuit node to cause the operator to notice whether or not the circuit node is a target to be measured, at a time of starting probing the circuit node without causing the operator to check a measuring point by his/her eyes.

It is also possible that the operation check support device further includes: a parasitic component addition unit configured to (i) calculate a parasitic component on the board based on shape information of a copper foil used on the board, and (ii) add data of the calculated parasitic component into a netlist representing the electronic circuit; and a simulation unit configured to simulate the operation of the electronic circuit based on the netlist added with the data by the parasitic component addition unit, to calculate the simulated signal waveforms, wherein the similarity calculation unit is configured to calculate a similarity between the measured waveform obtained by the waveform obtainment unit and each of the simulated signal waveforms calculated by the simulation unit.

With the above structure, the operator can immediately notice whether or not a currently measuring node is a node to be measured, at a time of starting the proving of the node in consideration of a parasitic component. The consideration of parasitic component allows accurate node determination.

It is further possible that the parasitic component addition unit is configured to (i) calculate an inductance parasitic component and a capacitance parasitic component of the copper foil based on the shape information, and (ii) add, to the netlist, data indicating the calculated inductance parasitic component and the calculated capacitance parasitic component of the copper foil as the data of the parasitic component, and the simulation unit is configured to perform numerical analysis on a node equation of the netlist added with the data by the parasitic component addition unit, to calculate transient property of one of a voltage and a current at each of the nodes, thereby calculating the simulated signal waveforms.

It is still further possible that the shape information includes a thickness of the copper foil, a length of the copper foil, a width of the copper foil, a thickness of the board, and a permittivity of the board.

Such information can express a copper foil having a complex shape.

It is still further possible that the operation check support device further includes an indication unit configured to indicate, to the operator, (a) a position of a node on the electronic circuit and (b) a position on the board, the position of the node being a position at which one of a voltage and a current is to be measured, and the position on the board corresponding to the position of the node and being a position at which the board is to be in contact with the probe, wherein the waveform obtainment unit is configured to obtain the measured waveform according to indication from the indication unit, the measured waveform being measured by the operator bringing the probe into contact with the board, and the notification unit is further configured to (i), when the position of the node on the electronic circuit which is determined by the position determination unit is the position of the node on the electronic circuit which is indicated by the indication unit, cause a display unit to display that the operator is bringing the probe into contact with a correct position, and (ii), when the position of the node on the electronic circuit which is determined by the position determination unit is not the position of the node on the electronic circuit which is indicated by the indication unit, cause the display unit to display the position on the board with which the operator brings the probe into contact and the position of the board which corresponds to the node indicated by the indication unit, based on board position information indicating positions on the board each of which corresponds to a corresponding one of the nodes on the electronic circuit.

With the above structure, if a wrong measuring point is measured, a positional relationship between the currently-measuring node and a node to be measured is presented. It is therefore possible to immediately start probing a node to be measured, eventually shortening a time required for the measurement. In addition, since error measurements are not mixed, it is possible to prevent that such an error measurement causes the operator to return to a previous measurement step.

It is still further possible that the similarity calculation unit is configured to compare the measured waveform obtained by the waveform obtainment unit to each of the simulated signal waveforms in a frequency domain using dynamic programming, to calculate the similarity between the measured waveform and each of the simulated signal waveforms.

More specifically, it is still further possible that the similarity calculation unit is configured to compare a frequency spectrum envelope of the measured waveform obtained by the waveform obtainment unit to a frequency spectrum envelope of each of the simulated signal waveforms by dynamic programming, to calculate the similarity between the measured waveform and each of the simulated signal waveforms.

It is still further possible that the similarity calculation unit is configured to compare the measured waveform obtained by the waveform obtainment unit to each of the simulated signal waveforms in a time domain using dynamic programming, to calculate the similarity between the measured waveform and each of the simulated signal waveforms.

If parasitic components are mixed in a waveform, the waveform is likely to be irregular and to include high-frequency components. In this case, comparison of both waveforms in a time domain is more stable than comparison of both waveforms in a frequency domain.

It is still further possible that the probe includes an acceleration and angular velocity sensor which measures an acceleration and an angular velocity, and the waveform obtainment unit is configured to obtain the measured waveform having: the acceleration that is smaller than or equal to a first threshold; and the angular velocity that is smaller than or equal to a second threshold, the acceleration and the angular velocity being measured by the acceleration and angular velocity sensor.

With the above structure, the waveform obtainment unit can obtain a measuring time waveform after a contact state of the probe to the node becomes stable, and the similarity calculation unit can start the similarity calculation. As a result, a similarity can be calculated with a high accuracy, thereby correctly determining a measuring point.

It is still further possible that the waveform obtainment unit is configured to obtain the measured waveform having: the acceleration that has been smaller than or equal to the first threshold for a first time period or more; and the angular velocity that has been smaller than or equal to the second threshold for a second time period or more after the first time period, the acceleration and the angular velocity being measured by the acceleration and angular velocity sensor.

In another general aspect, the techniques disclosed here feature an operation check support device that supports an operator in checking an operation of an electronic circuit mounted on a board, the operation check support device comprising: an indication unit configured to indicate, to the operator, (a) a position of a node on the electronic circuit and (b) a position on the board, the position of the node being a position at which one of a voltage and a current is to be measured, and the position on the board corresponding to the position of the node and being to be in contact with a probe; a waveform obtainment unit configured to obtain a measured waveform according to the indication from the indication unit, the measured waveform being a signal waveform of one of a voltage and a current, and the measured waveform being measured by the operator bringing the probe into contact with the board; a similarity calculation unit configured to calculate a similarity between the measured waveform obtained by the waveform obtainment unit and each of simulated signal waveforms, the each of simulated signal waveforms being a signal waveform of one of a voltage and a current at a corresponding one of nodes on the electronic circuit, and the each of simulated signal waveforms being obtained by simulating the operation of the electronic circuit; a position determination unit configured to determine a position of a node among the nodes on the electronic circuit based on node information, the node corresponding to a simulated signal waveform having a maximum similarity calculated by the similarity calculation unit, the node information indicating positions of the nodes on the electronic circuit, and the nodes each corresponding to a corresponding one of the simulated signal waveforms; and the notification unit configured to (i), when the position of the node on the electronic circuit which is determined by the position determination unit is the position of the node on the electronic circuit which is indicated by the indication unit, cause a display unit to display that the operator brings the probe into contact with a correct position, and (ii), when the position of the node on the electronic circuit which is determined by the position determination unit is not the position of the node on the electronic circuit which is indicated by the indication unit, cause the display unit to display the position on the board with which the operator brings the probe into contact and the position of the board which corresponds to the node indicated by the indication unit, based on board position information indicating positions on the board each of which corresponds to a corresponding one of the nodes on the electronic circuit.

With the above structure, a simulated signal waveform that is the most similar to a measured waveform measured by the operator bringing the probe into contact with a target is determined, and a position of a node corresponding to the simulated signal waveform is determined on the electronic circuit. As a result, it is possible to providing, as feedback, the operator with information regarding a currently-measuring circuit node to cause the operator to notice whether or not the circuit node is a target to be measured, at a time of starting probing the circuit node without causing the operator to check a measuring point by his/her eyes. In particular, if a wrong measuring point is measured, a positional relationship between the currently-measuring node and a node to be measured is presented. It is therefore possible to immediately start probing a node to be measured, eventually shortening a time required for the measurement. In addition, since error measurements are not mixed, it is possible to prevent that such an error measurement causes the operator to return to a previous measurement step.

It should be noted that these general or specific aspects may be implemented as a system, a method, an integrated circuit, a computer program, or a computer-readable recording medium stored such as CD-ROM, or a desired combination of the system, the method, the integrated circuit, the computer program, and the computer-readable recording medium.

Hereinafter, certain exemplary embodiments are described with reference to the accompanying Drawings.

Each of the exemplary embodiments described below shows a general or specific example. The numerical values, shapes, materials, structural elements, the arrangement and connection of the structural elements, steps, the processing order of the steps etc. shown in the following exemplary embodiments are mere examples, and therefore do not limit the scope of the appended Claims and their equivalents. Therefore, among the structural elements in the following exemplary embodiments, structural elements not recited in any one of the independent claims are described as arbitrary structural elements.

Embodiment 1

Figure 2:
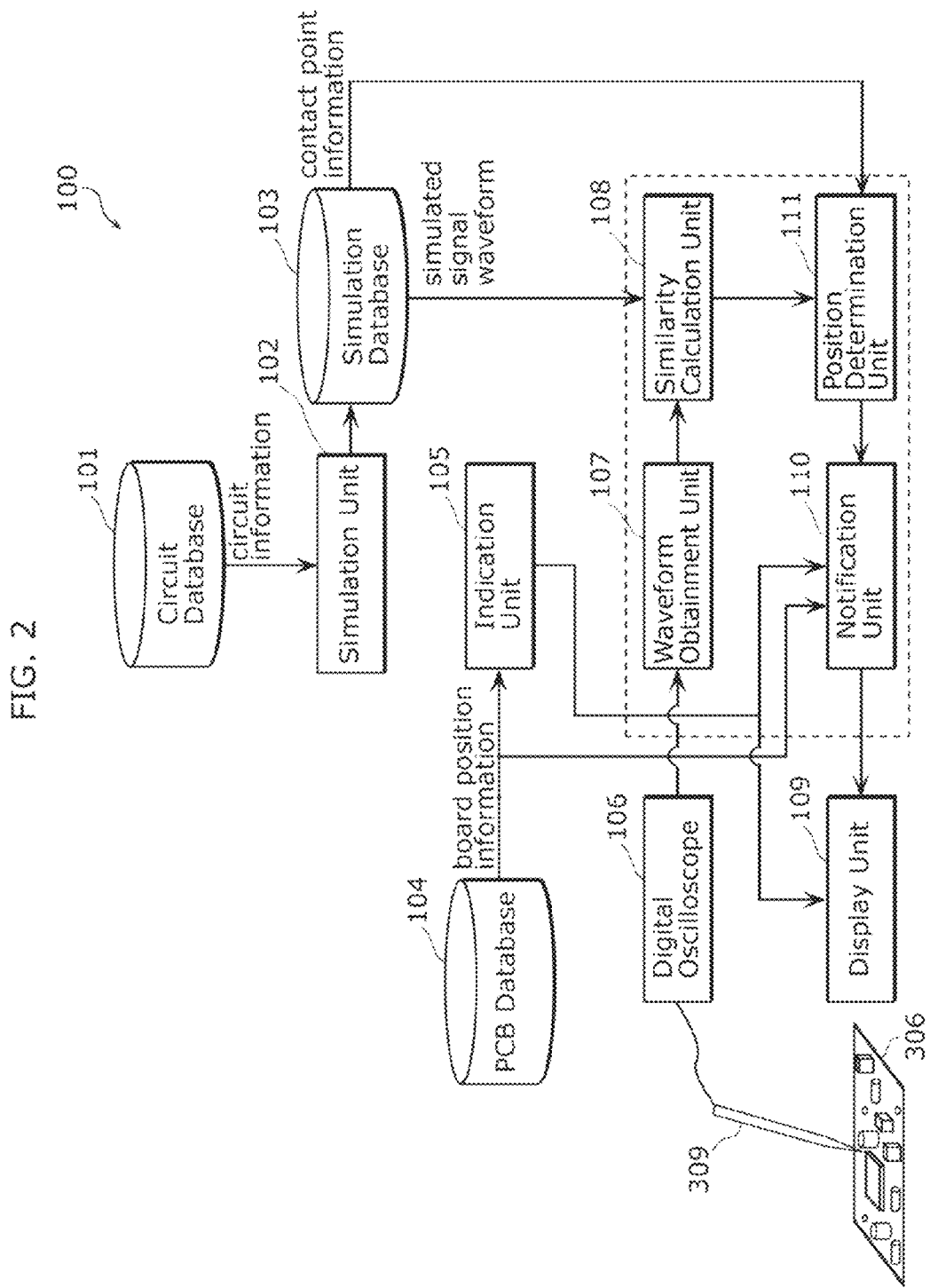
FIG. 2 is a block diagram showing a functional structure of an operation check support device according to Embodiment 1.

FIG. 2 is a block diagram showing a functional structure of an operation check support device according to Embodiment 1. The operation check support device 100 includes a circuit database 101, a simulation unit 102, a simulation database 103, a PCB database 104, an indication unit 105, a digital oscilloscope 106, a waveform obtainment unit 107, a similarity calculation unit 108, a display unit 109, a notification unit 110, and a position determination unit 111.

<Use Scene>

Figure 3:
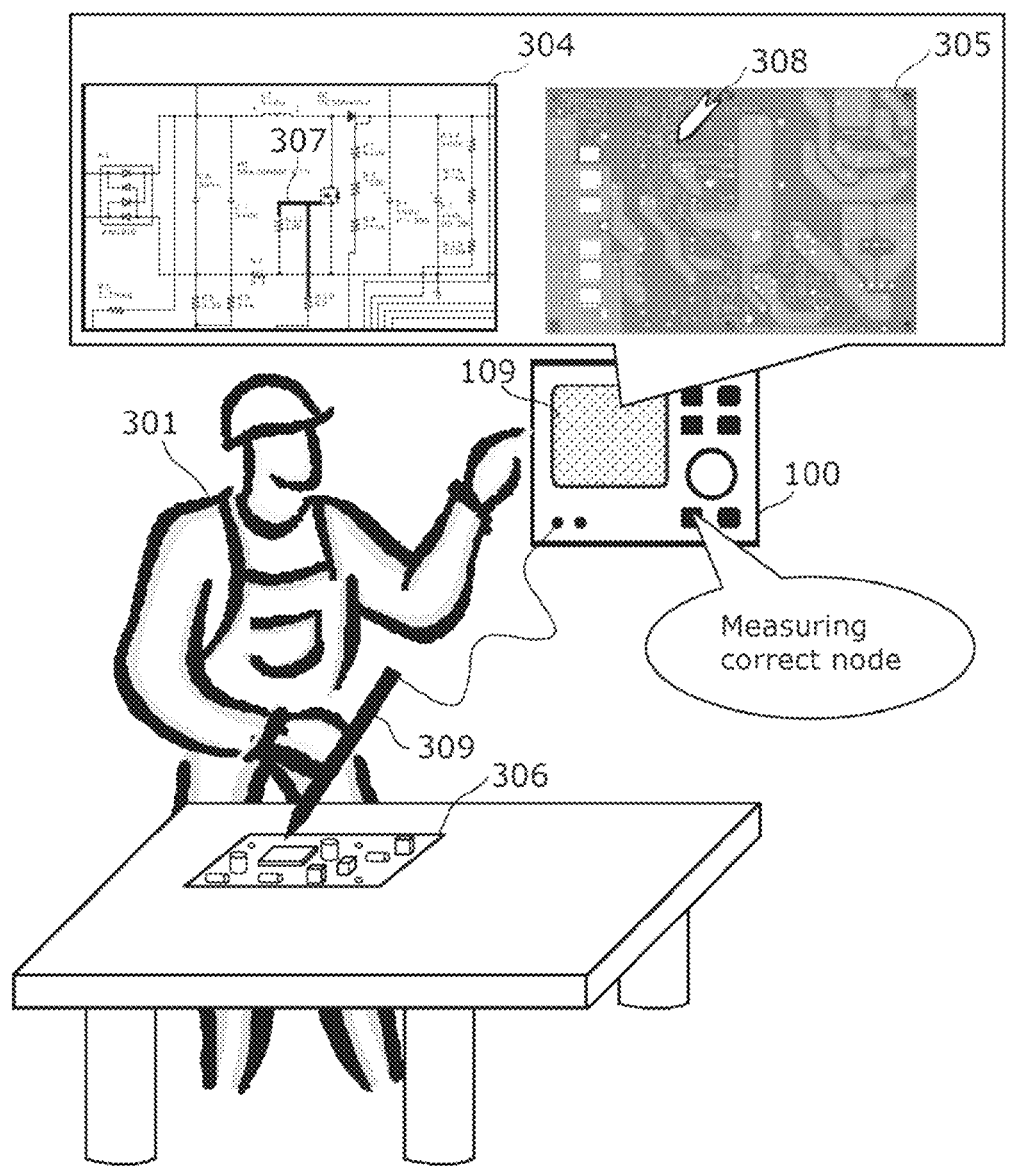
FIG. 3 is a diagram showing a use scene of the operation check support device according to Embodiment 1.

FIG. 3 shows a use scene of the operation check support device 100 according to the present embodiment. The display unit 109 displays: a circuit diagram 304 of a circuit mounted on a PCB 306; and a PCB layout 305. On the circuit diagram 304, the display unit 109 displays a position of a certain electronic part. On the PCB layout 305, the display unit 109 displays a position corresponding to the certain electronic part on the circuit diagram 304. For example, as shown in FIG. 3, a currently-measuring point may be shown by an arrow like a measuring point 308, by a different color like a measuring point 307, or by flashing. The display unit 109 performs displaying so that at least an operator 301 checking operations of the PCB can determine one of a plurality of electronic parts displayed on the PCB layout 305.

The operator 301 actually measures a node voltage or the like of an electronic part on the PCB 306 with reference to the circuit diagram 304 and the PCB layout 305 which are displayed on the display unit 109. In more detail, the operator 301 measures a voltage or a current by bringing a probe 309 connected with the digital oscilloscope 106 in FIG. 2 into contact with a node of an electronic part on the PCB 306. Hereinafter, it is assumed that the operator 301 measures a voltage. However, if the same processing is performed for measuring a current, the operation check support device 100 can support the operator 301 in checking operations of the PCB 306.

On the circuit diagram 304, the display unit 109 displays, as the measuring point 307, a point at which the operator 301 is to measure a voltage. On the PCB layout 305, the display unit 109 displays the same point as the measuring point 308. The operator 301 brings the tip of the probe 309 into contact with the measuring point on the PCB 306 corresponding to the measuring point 308, with reference to the measuring point 307 on the circuit diagram 304 and the measuring point 308 on the PCB layout 305.

Figure 4:
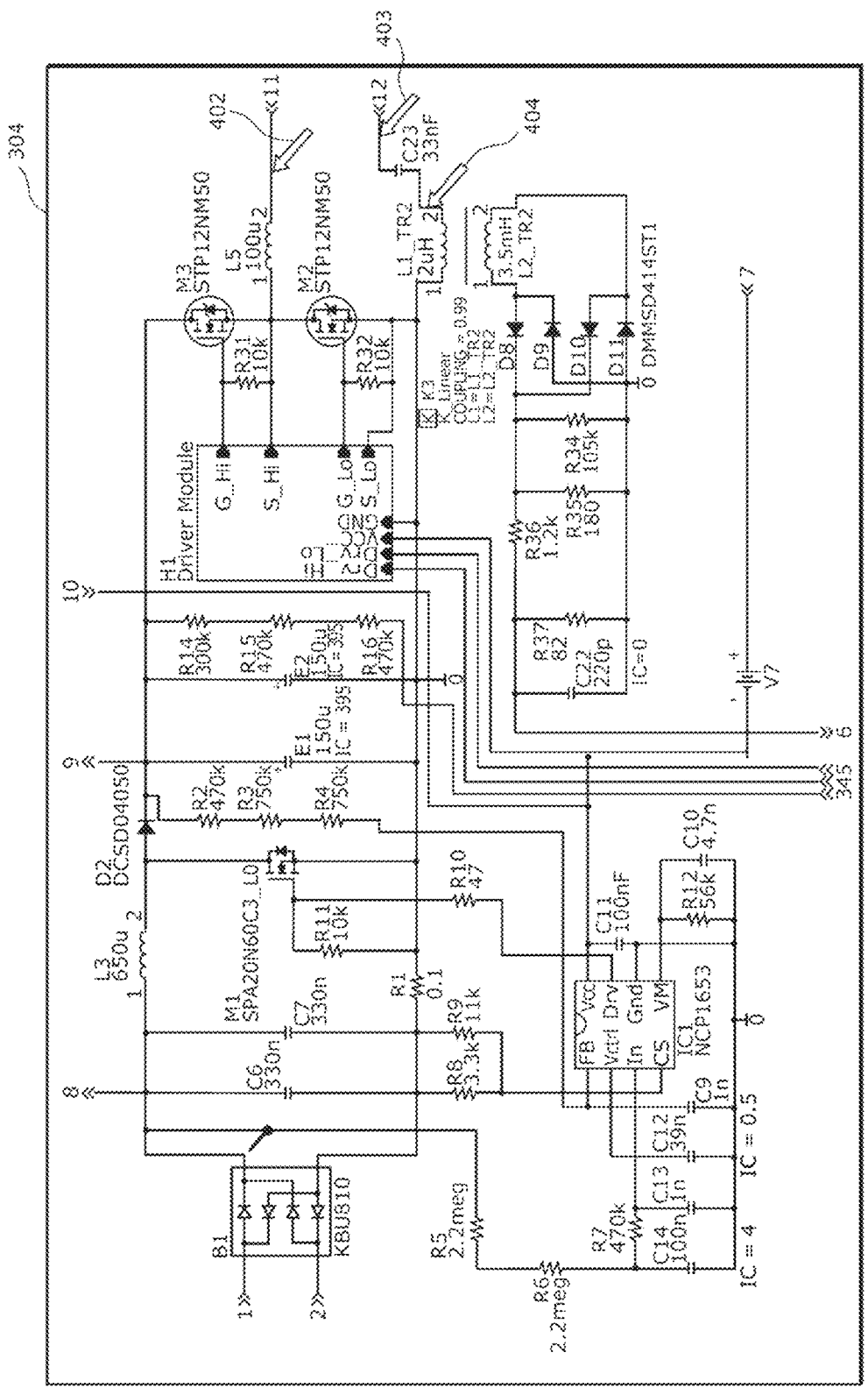
FIG. 4 is a diagram showing an example of a circuit diagram stored in a circuit database according to Embodiment 1.

For example, if the measuring point 308 on the PCB layout 305 matches the measuring point on the PCB 306 to which the operator 301 brings the tip of the probe 309 into contact, the notification unit 110 emits an audio message "measuring a correct node" to the operator 301. If the operator 301 is probing a wrong measuring point, the notification unit 110 may cause the display unit 109 to display a positional relationship between the currently-probing node (measuring point) and a node (measuring point) to be measured. For example, as shown in FIG. 4, the notification unit 110 may show such a positional relationship, by causing the display unit 109 to display a currently-probing node 402 and a to-be-measured node 403 by arrows.

<Structure>

The following describes each of the structural elements in the operation check support device 100.

The circuit database 101 stores circuit information of an electronic circuit for which a voltage is to be measured. In the present disclosure, "circuit information" refers to information of a plurality of electronic parts included in an electronic circuit. The circuit information includes plural pieces of electronic part information.

For example, the circuit information includes pieces of information each indicating a kind of corresponding one of the electronic parts on the circuit, or a netlist. The netlist includes connection information among terminals of the electronic parts in the electronic circuit. For example, circuit information designed by an EDA tool is stored in the circuit database 101. More specifically, circuit information is expressed by a Simulation Program with Integrated Circuit Emphasis (SPICE) netlist format. For example, the circuit diagram 304 shown in FIG. 4 is expressed by a netlist 501 shown in FIG. 5. The netlist 501 shown in FIG. 5 includes pieces of information of kinds of electronic parts, pieces of information for determining the electronic parts, and pieces of connection information among the terminals of the electronic parts. In the netlist shown in FIG. 5, each row indicates pieces of information regarding a single electronic part.

The simulation unit 102 calculates a signal waveform of each of the nodes in the electronic circuit, by simulating operation of the electronic circuit. For example, transient analysis is applied to calculate a signal waveform of each of the nodes included in the electronic circuit. The transient analysis is a method for detecting a temporal change in a voltage or a current.

For example, the simulation unit 102 is implemented by using a known SPICE simulator. More specifically, a SPICE simulator disclosed in Non-Patent Literature (Nagel, L. W, and Pederson, D. O., SPICE (Simulation Program with Integrated Circuit Emphasis), Memorandum No, ERL-M382 University of California Berkeley, April 1973) is used.

The simulation database 103 stores pieces of information of simulated signal waveforms generated by the simulation unit 102 simulating signal waveforms of respective nodes. For example, the simulation database 103 stores results of transient analysis for the respective nodes. Here, the simulation database 103 stores a piece of simulated signal waveform information in association with corresponding one of node information. The node information is information (node information) indicating at least a position of a corresponding node in the electronic circuit, such as a kind of a corresponding electronic part, a netlist, or the like.

Figure 6A:
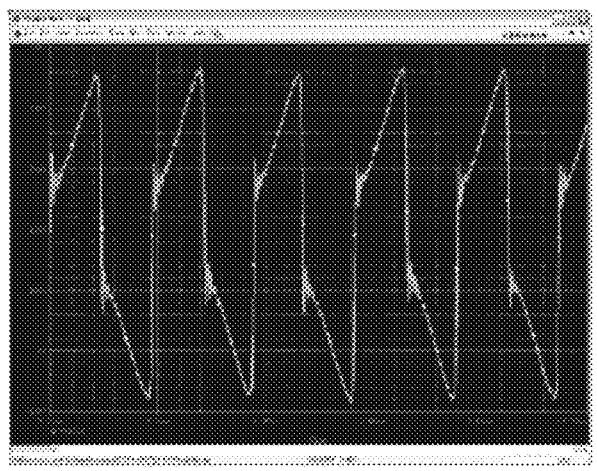
FIG. 6A is a diagram showing an example of a time waveform stored in a simulation database according to Embodiment 1.
Figure 6B:
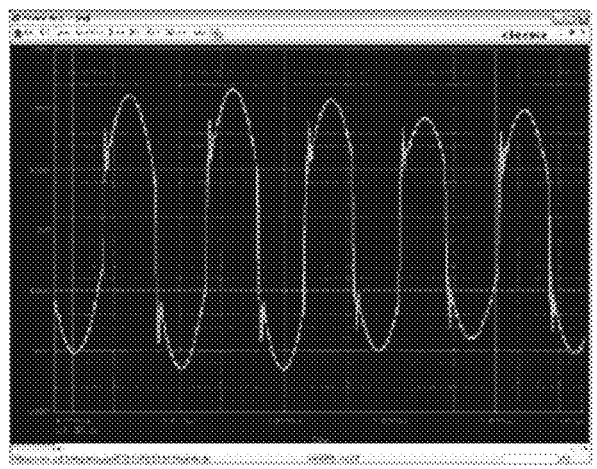
FIG. 6B is a diagram showing an example of a time waveform stored in the simulation database according to Embodiment 1.
Figure 6C:
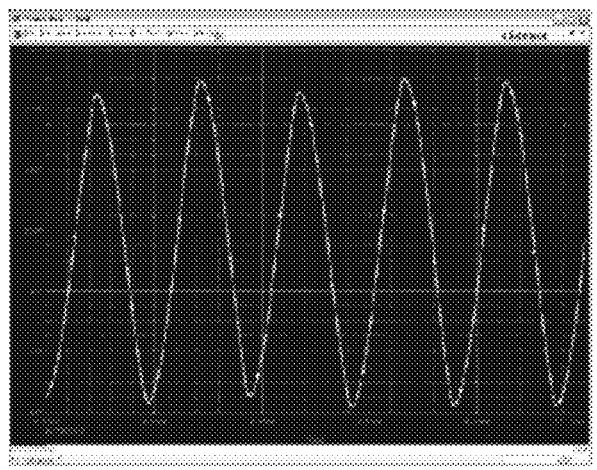
FIG. 6C is a diagram showing an example of a time waveform stored in the simulation database according to Embodiment 1.

For example, an example of a simulated signal waveform of the node 402 in FIG. 4 is shown in FIG. 6A, an example of a simulated signal waveform of the node 403 in FIG. 4 is shown in FIG. 6B, and an example of a simulated signal waveform of the node 404 in FIG. 4 is shown in FIG. 6C. A time waveform (simulated signal waveform) obtained for a node k (k=1, . . . , n) is abstracted as $f\_s\_k(t)$. Here, t is a discrete time.

The digital oscilloscope 106 measures a signal waveform in a state where the probe is connected to a node of the PCB. For example, the operator 301 brings the probe into contact with the electronic circuit on which electronic parts are mounted. In this state, the digital oscilloscope 106 measures (detects) a signal waveform. More specifically, the operator 30 connects the probe to a certain node of the PCB.

The waveform obtainment unit 107 obtains the signal waveform measured by the digital oscilloscope 106.

Figure 7:
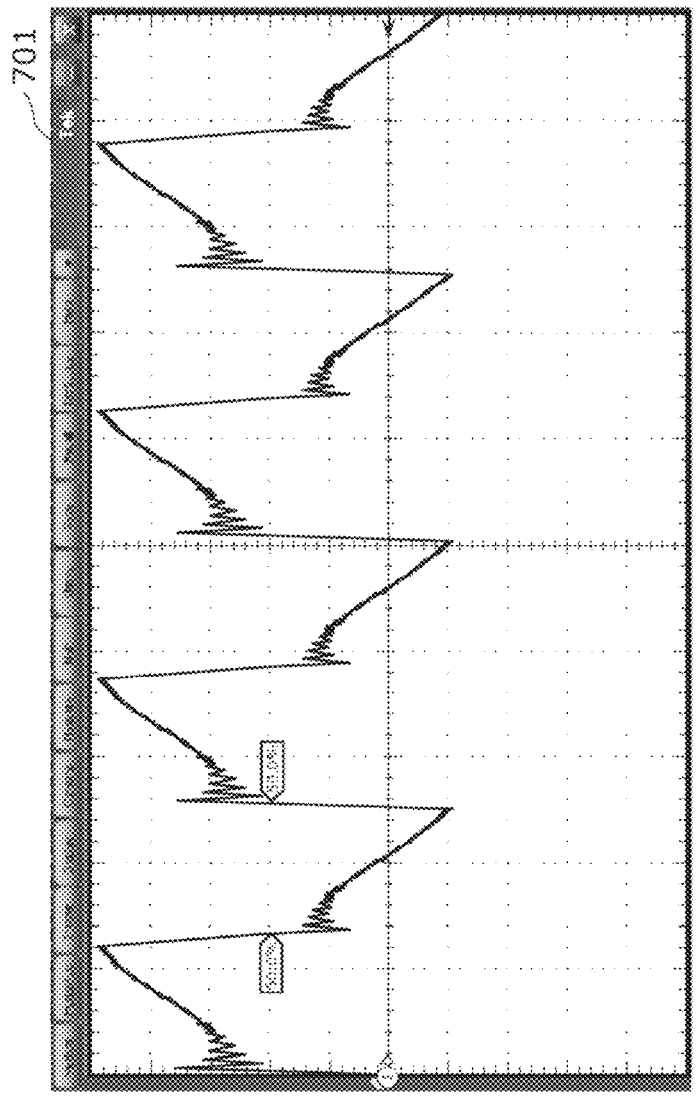
FIG. 7 is a diagram showing an example of a time waveform obtained by a waveform obtainment unit according to Embodiment 1.

More specifically, the waveform obtainment unit 107 obtains a measured waveform $f\_r(t)$ of a measured node on the PCB. Here, since t is a value sampled at a fixed interval $\Delta T$, t is a discrete time. FIG. 7 shows an example of a measured waveform 701 that is a time waveform measured by the waveform obtainment unit 107.

The PCB database 104 stores board position information. The board position information is information indicating positions on the PCB each of which corresponds to corresponding one of the nodes on the electronic circuit.

The indication unit 105 indicates, to the operator 301, a node position at which a voltage or a current is to be measured on the electronic circuit, and a position which corresponds to the node position and with which the probe is to be in contact on the PCB 306. More specifically, on the display unit 109, the indication unit 105 displays (a) the circuit diagram 304 of the circuit mounted on the PCB 306 and (b) the PCB layout 305, as shown in FIG. 3. The indication unit 105 displays, as node positions corresponding to each other, (a) the measuring point 307 onto the circuit diagram 304, and (b) the measuring point 308 onto the PCB layout 305.

The display unit 109 is a liquid crystal display or the like.

The similarity calculation unit 108 calculates a similarity between a simulated signal waveform $f\_s\_k(t)$ and a measured waveform $f\_r(t)$ for each k(k=1, . . . , n). A method of calculating a similarity will be described later in more detail.

The position determination unit 111 selects a simulated signal waveform that is the most similar to the measured waveform $f\_r(t)$, based on similarities calculated by the similarity calculation unit 108. In other words, the position determination unit 111 selects a simulated signal waveform having a maximum similarity. In addition, the position determination unit 111 determines a node position that is on the electronic circuit and corresponds to the selected simulated signal waveform, with reference to the pieces of node information stored in the simulation database 103.

For example, the position determination unit 111 determines a node position corresponding to a maximum similarity, from among similarities $d\_k$ (k=1 to n). For example, from among similarities calculated between the measured waveform 701 shown in FIG. 7 and each of the simulated signal waveforms shown in FIGS. 6A to 6C, the similarity calculated between the measured waveform 701 shown in FIG. 7 and the simulated signal waveform shown in FIG. 6A is maximum. Therefore, the position determination unit 111 outputs information indicating a position of the node 402 corresponding to the simulated signal waveform of FIG. 6A.

If the node position determined by the position determination unit 111 matches the node position indicated by the indication unit 105 on the electronic circuit, the notification unit 110 displays, on the display unit 109, that the operator 301 brings the probe into contact with a correct position. Furthermore, if the node position determined by the position determination unit 111 on the electronic circuit does not match the node position indicated by the indication unit 105 on the electronic circuit, the notification unit 110 displays (a) a position to which the operator 301 brings the probe in contact on the PCB and (b) the position corresponding to the node indicated by the indication unit 105 on the PCB, based on the board position information stored in the PCB database 104.

It should be noted that the notification unit 110 may notify these pieces of information to the operator 301 by audio, not by displaying them on the display unit 109. For example, the notification unit 110 may cause an audio synthesis device (not shown) connected to the notification unit 110, to emit an audio message such as "The currently measuring node is x." for the node x determined by the position determination unit 111. In the above example, the notification unit 110 causes the audio synthesis device to emit an audio message such as "The currently measuring node is 402."

<Processing Flow>

Next, the flow of the processing performed by the operation check support device 100 is described.

Figure 8:
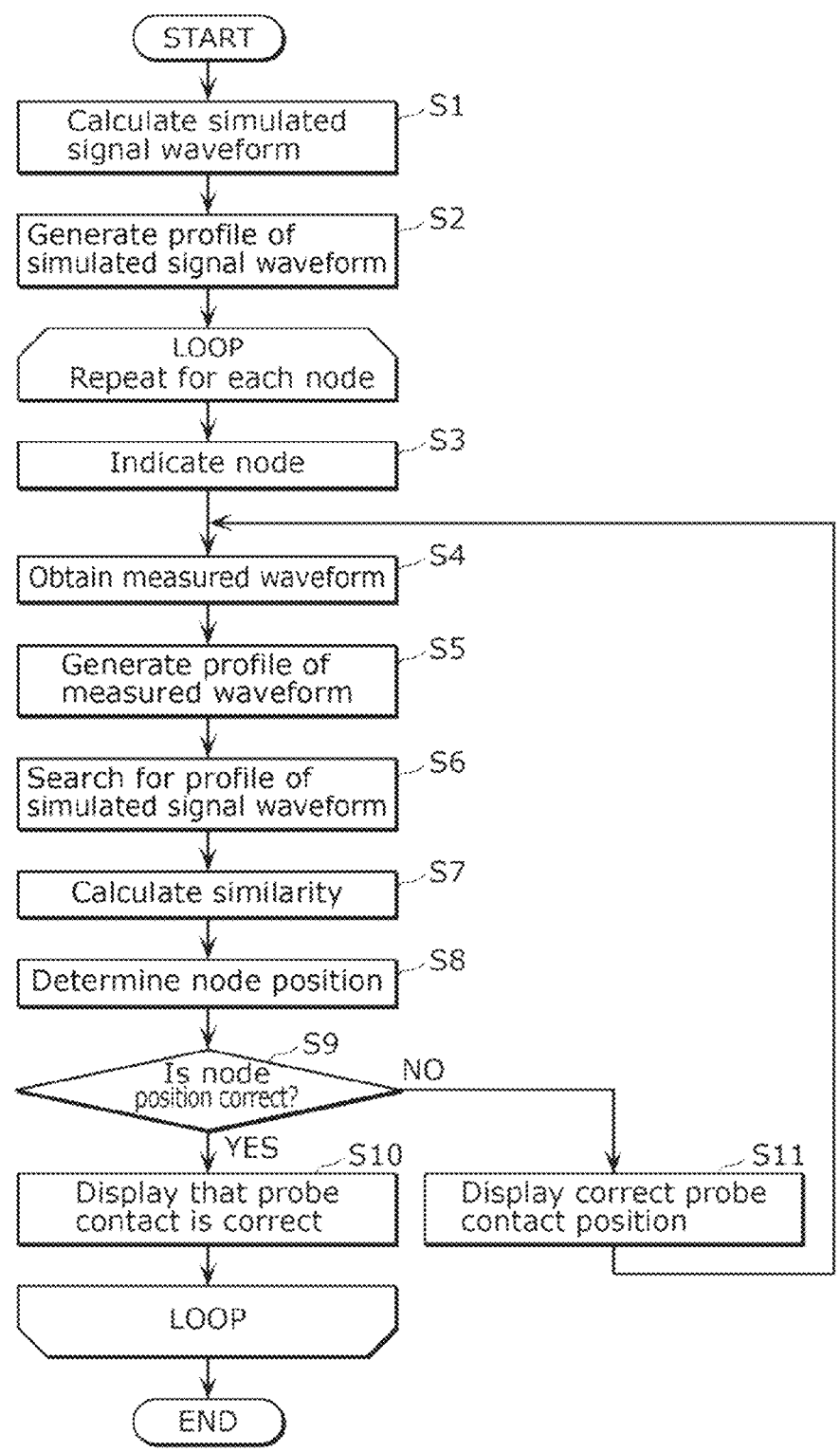
FIG. 8 is a flowchart of processing performed by the operation check support device according to Embodiment 1.

FIG. 8 is a flowchart of the processing performed by the operation check support device 100.

The simulation unit 102 simulates a signal waveform of each of the nodes included in the electronic circuit, and writes information of the simulated signal waveform to the simulation database 103 (S1).

Figure 9:
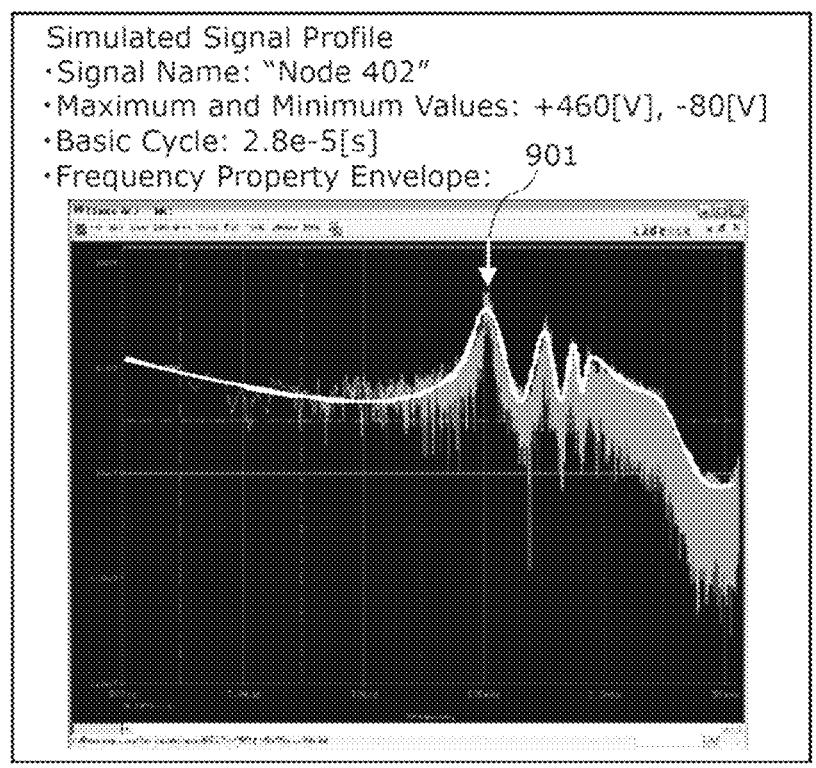
FIG. 9 is a diagram showing an example of a profile of a simulated signal waveform according to Embodiment 1.

The simulation unit 102 generates a profile including maximum and minimum values, a basic cycle, and a frequency property envelope for each of the simulated signal waveforms (S2). For example, FIG. 9 shows a profile generated for the simulated signal waveform of the node 402. Maximum and minimum values are obtained by scanning a simulated signal waveform on a time axis and picking up a maximum value and a minimum value of an amplitude. A basic cycle is an inverse of a minimum frequency among frequencies of peaks in a power spectrum envelope (frequency property envelope) of a signal in a frequency domain to which a simulated signal waveform is transformed using discrete Fourier transform.

A power spectrum envelope F_s_k(f) is obtained by performing Fourier transform on a power spectrum again and performing inverse Fourier transform only on a low-order coefficient of the result. In the example of FIG. 9, an inverse of a frequency of a peak 901 is set to a basic cycle, according to a power spectrum envelope shown in a thick line.

Figure 10:
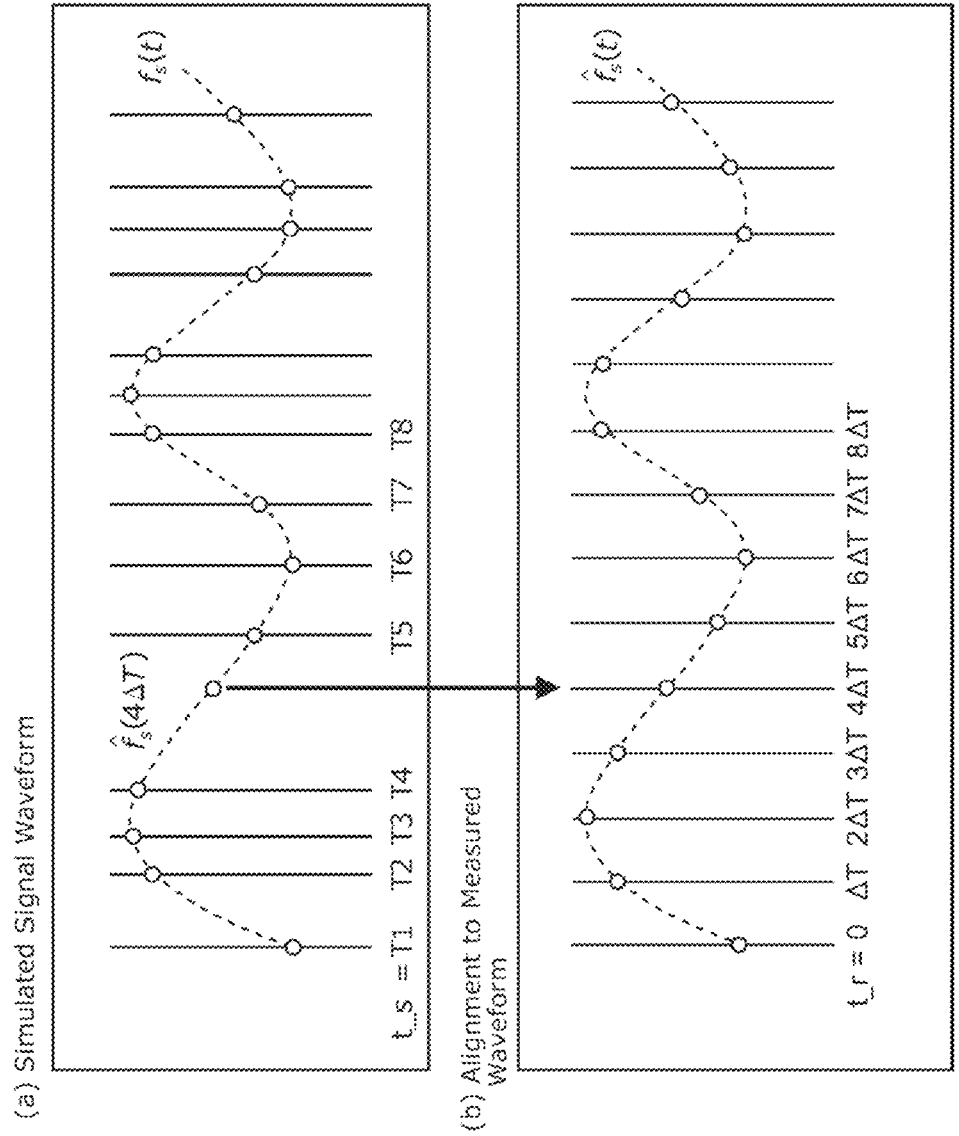
FIG. 10 is a diagram showing an example of an alignment method for the simulated signal waveform according to Embodiment 1.

As described previously, intervals between discrete times in a simulated signal waveform are not equal. Therefore, the simulation unit 102 performs discrete Fourier transform after aligning the simulated signal waveform to have equal intervals that are the same as the intervals in a measured waveform. FIG. 10 shows an example of the alignment. It is almost impossible to directly sample a simulated signal waveform $f_s(t)$ in (a) of FIG. 10 at a sampling cycle $\Delta T$ of the measured waveform. Therefore, the simulation unit 102 estimates a sampling value by using following Equation 1.

[Math. 1]

$$\hat{f}_s(t) = \frac{f_s(t_{s2}) - f_s(t_{s1})}{t_{s2} - t_{s1}}(1 - t_{s1}) + f_s(t_{s1}) \qquad \text{(Equation 1)}$$

The simulation unit 102 obtains $t_{s1}$ and $t_{s2}$ (where $\max t_{s1} \le t \le \min t_{s2}$) for $t = k\Delta T$, and thereby calculates a value of Equation 1.

(b) of FIG. 10 shows an example of an aligned simulated signal waveform.

Next, the operation check support device 100 performs the following processing from S3 to S11 for each of the nodes (measuring points) on the electronic circuit.

As shown in FIG. 3, the indication unit 105 displays, on the display unit 109, (a) the circuit diagram 304 of the circuit implemented on the PCB 306 and (b) the PCB layout 305. Moreover, the indication unit 105 shows, as node positions corresponding to each other, the measuring point 307 on the circuit diagram 304, and the measuring point 308 on the PCB layout 305 (S3). The positions of the measuring points are assumed to be predetermined.

The waveform obtainment unit 107 obtains a waveform measured by the digital oscilloscope 106 by probing by the operator 301 according to the information of the measuring point 308 on the PCB layout displayed on the display unit 109 (S4).

Figure 11:
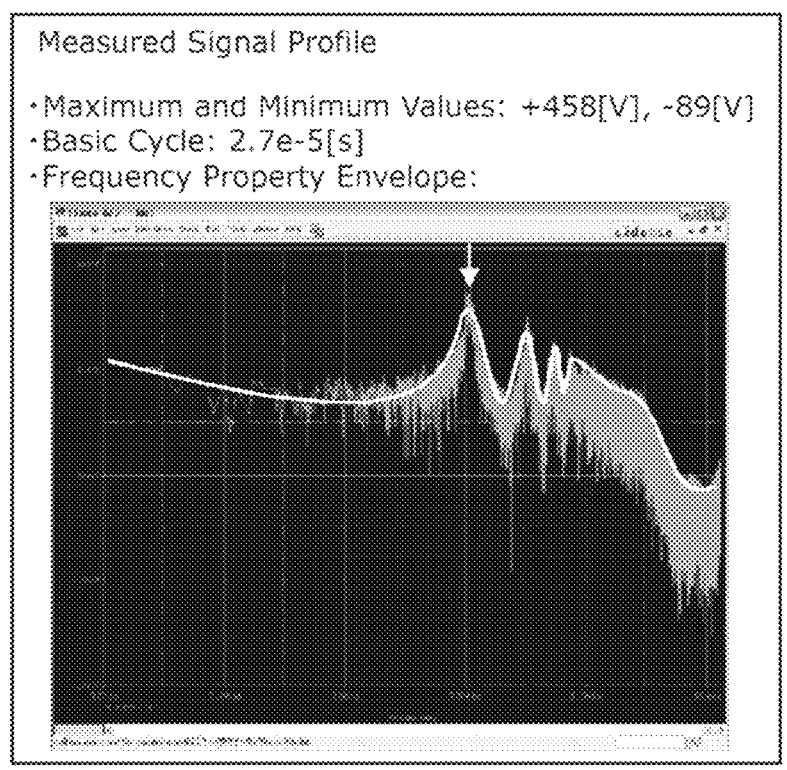
FIG. 11 is a diagram showing an example of a profile of a measured waveform according to Embodiment 1.

Furthermore, the waveform obtainment unit 107 performs the same processing as S2, thereby generating a profile of the measured waveform which is the same as the profile of the simulated signal waveform (S5). For example, FIG. 11 shows a profile generated for a measured waveform 701. A power spectrum envelope of the measured waveform 701 is referred to as F_r(f).

The similarity calculation unit 108 extracts a profile that is similar to the profile of the measured waveform, from profiles of all simulated signal waveforms (S6). For example, the similarity calculation unit 108 extracts a profile of a simulated signal waveform having (a) a difference in a maximum value between amplitudes of the simulated signal waveform and the measured waveform which is smaller than or equal to a first threshold, (b) a difference in a minimum value between the amplitudes which is smaller than or equal to a second threshold, and (c) a difference in a basic cycle between the waveforms which is smaller than or equal to a third threshold.

The similarity calculation unit 108 calculates a similarity between each of the simulated signal waveforms and the measured waveform, based on profiles of the simulated signal waveforms extracted at S6 (S7). The similarity calculation unit 108 calculates a similarity between a spectrum envelope F_s_k(f) of the simulated signal waveform and a spectrum F_r(f) of the measured waveform, as a similarity between the simulated signal waveform f_s_k(t) and the measured waveform f_r(t), by using dynamic programming (in other words, a dynamic time warping).

FIG. 12 shows a known dynamic programming algorithm. By this algorithm, as a similarity between a measured waveform f_r(t) and a simulated signal waveform f_s_k(t) of a node k, a similarity d_k(F_r(f), F_s_k(f)) between a spectrum envelope F_s_k(f) of the simulated signal waveform and a spectrum envelope F_r(f) of the measured waveform is obtained.

The position determination unit 111 determines a position of a node k having a similarity d_k that is maximum.

The notification unit 110 determines whether or not the position of the node k which is determined by the position determination unit 111 matches the position of the measuring point 307 on the circuit diagram 304 which is indicated by the indication unit 105 at S3 (S9).

If the both positions match each other (YES at S9), then the notification unit 110 causes the display unit 109 to display that the operator 301 brings the probe into contact with a correct position (S10).

On the other hands, if the both positions do not match (No at S9), the notification unit 110 causes, based on the board position information stored in the PCB database 104, the display unit 109 to display (a) the position in contact with the probe by the operator 301, and (b) a position which is on the PCB and corresponds to the node indicated by the indication unit 105 (S11). Thereby, the notification unit 110 causes the display unit 109 to display a correct contact position of the probe. The operator 301 performs probing again to repeat the steps from S4.

According to the present embodiment, the operator can immediately notice whether or not a currently measuring node is a circuit node to be measured, at a time of starting the proving of the circuit node. Therefore, even if the operator is measuring a wrong measuring point, it is possible to immediately correct the measuring point, and eventually shorten a time required for the measurement. In addition, since error measurements are not mixed, it is possible to prevent that such an error measurement causes the operator to return to a previous measurement step.

It should be noted that it has been described that the notification unit 110 determines whether or not a contact position of the probe, namely, a node position determined by the position determination unit 111, is a correct position. However, it is also possible that the notification unit 110 merely causes the display unit 109 to display a node position determined by the position determination unit 111, or to emit audio, in order to notify them to the operator 301.

It should also be noted that it has been described that the display unit 109 displays the circuit diagram 304 and the PCB layout 305 as shown in FIG. 3, but it is also possible to display only one of them.

Embodiment 2

The Embodiment 2 differs from Embodiment 1 in the processing using a measured waveform measured while the probe is stable. In the following description, the same structure as that in Embodiment 1 is not explained again.

The operation check support device according to Embodiment 2 has almost the same structure as that of the operation check support device 100 shown in FIG. 2. However, the operation check support device according to Embodiment 2 differs from the operation check support device 100 in a structure of the probe connected to the digital oscilloscope 106 and in processing performed by the waveform obtainment unit 107.

Figure 13:
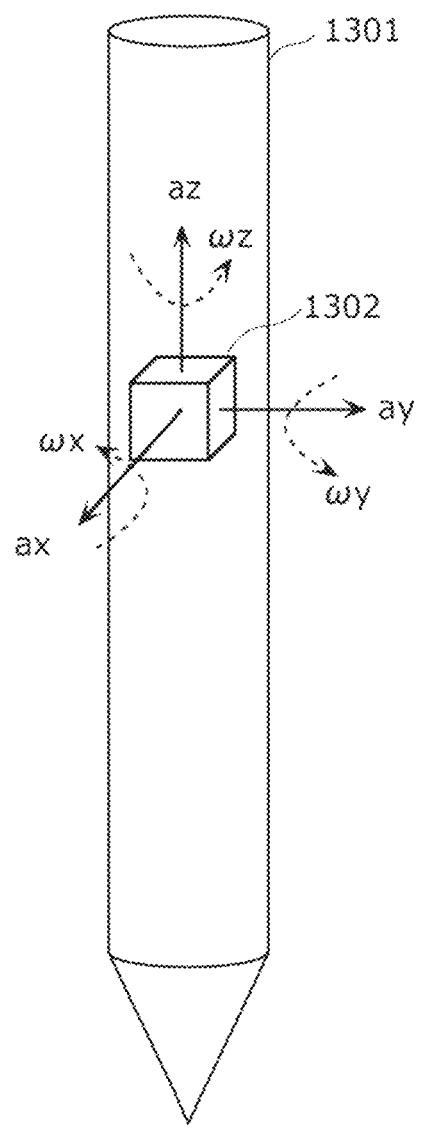
FIG. 13 is a diagram showing a structure of a probe according to Embodiment 2.

The waveform obtainment unit 107 obtains a measured waveform $f\_r(t)$ of a node on the PCB measured using the digital oscilloscope 106. Here, t is a discrete time. As shown in FIG. 13, in a probe 1301 connected to the digital oscilloscope 106, a small three-axis acceleration and angular velocity sensor 1302 manufactured using Micro Electro Mechanical Systems (MEMS) technique is embedded. It should be noted that the three-axis acceleration and angular velocity sensor 1302 may not be embedded in the probe 1301, but may be externally attached to the probe 1301.

Figure 14:
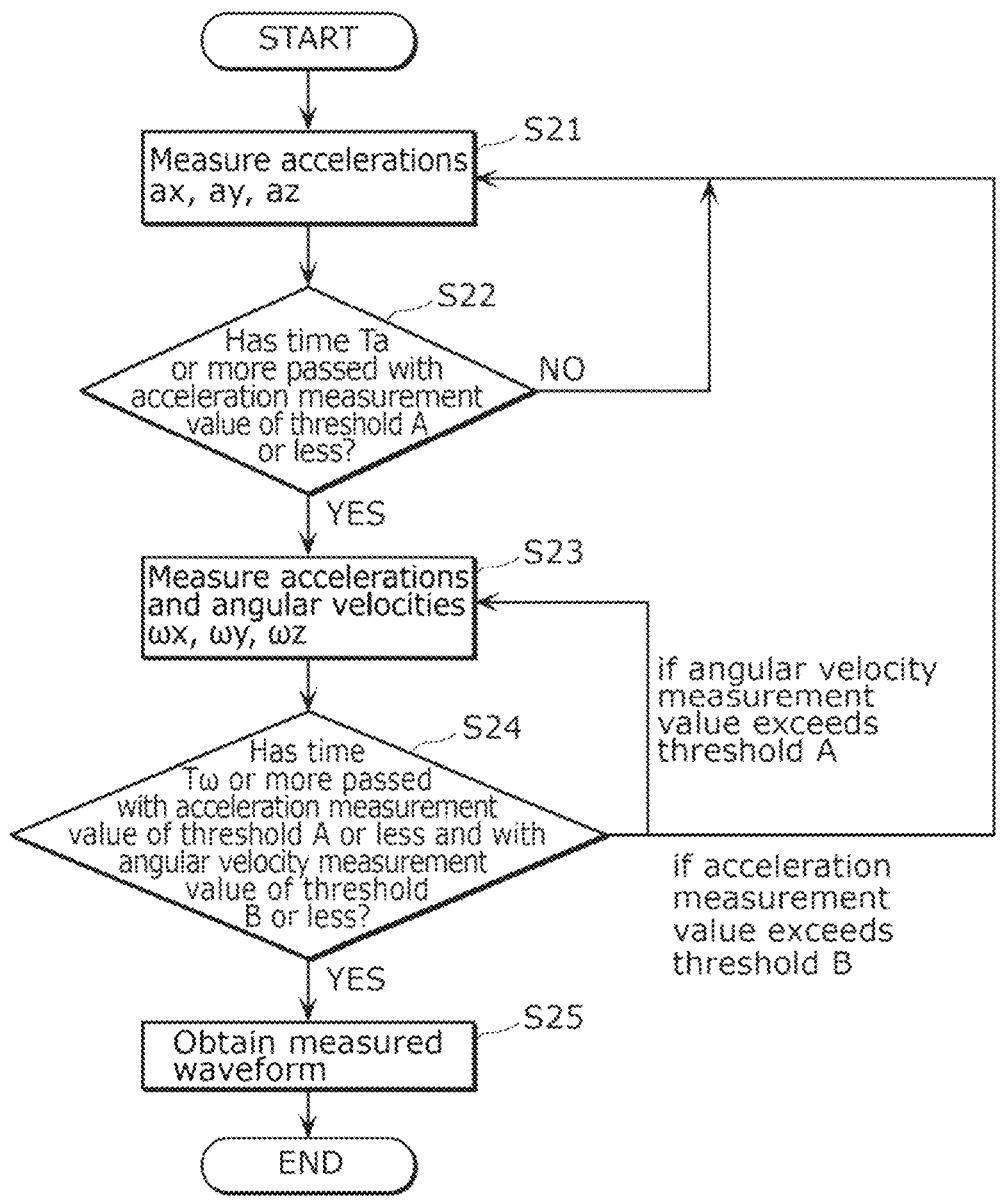
FIG. 14 is a flowchart of processing performed by a waveform obtainment unit according to Embodiment 2.

FIG. 14 is a flowchart of details of the measured waveform obtainment step (S4) of FIG. 8.

The waveform obtainment unit 107 measures an acceleration ax in x-axis direction, an acceleration ay in y-axis direction, and an acceleration az in z-axis direction, sampling outputs of the three-axis acceleration and angular velocity sensor 1302 at certain intervals (S21).

The waveform obtainment unit 107 determines whether or not a state where an acceleration measurement value (as described later) is smaller than or equal to the threshold A has been kept for a time period Ta or more (S22). Here, the acceleration measurement value is assumed to |ax|+|ay|+|az|. The threshold A and the time period Ta are predetermined.

Figure 15:
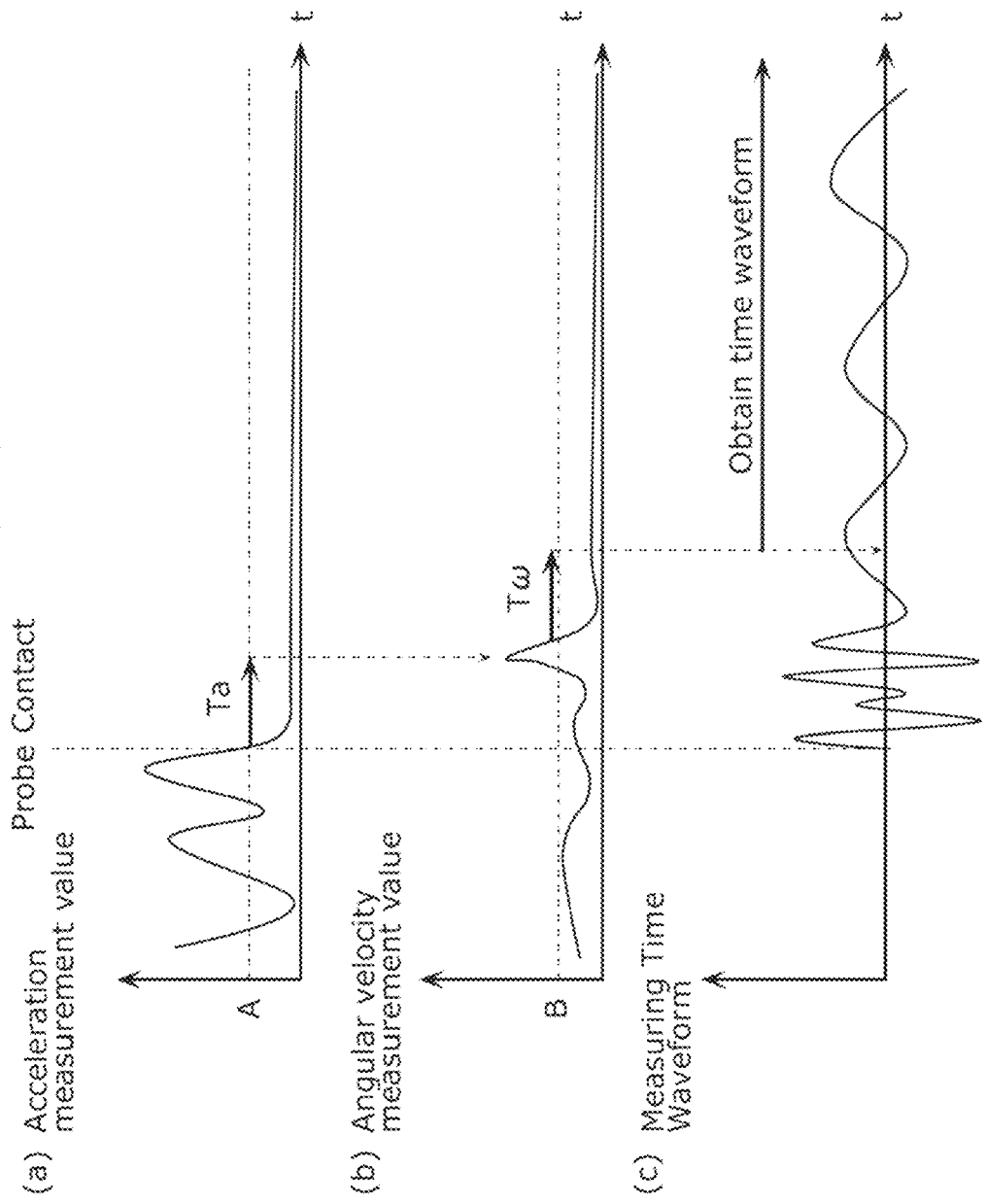
FIG. 15 is a chart of relationships among values measured by a three-axis acceleration/angular velocity sensor according to Embodiment 2.

As shown in (a) of FIG. 15, if the state has been kept for the time period Ta or more, the processing proceeds to S23. On the other hand, if the acceleration measurement value exceeds the threshold A within the time period Ta, the processing returns to S21.

At S23, the waveform obtainment unit 107 measures accelerations ax, ay, and az, and angular velocities ωx, ωy, and ωz, sampling outputs of the three-axis acceleration and angular velocity sensor 1302 at certain intervals. The angular velocity ωx is an angular velocity in x-axis direction, the angular velocity ωy is an angular velocity in y-axis direction, and the angular velocity ωz is an angular velocity in z-axis direction.

The waveform obtainment unit 107 determines whether or not a state where the acceleration measurement value is smaller than or equal to the threshold A and an angular velocity measurement value (as described later) is smaller or equal to the threshold B has been kept for a time period Tω or more (S24). Here, the angular velocity measurement value is assumed to |ωx|+|ωy|+|ωz|. The threshold B and the time period Tω are predetermined.

If the state has been kept for the time period Tω or more as shown in (b) of FIG. 15, the waveform obtainment unit 107 starts obtaining a waveform measured by the digital oscilloscope 106 from the time where the state exceeds the time period Tω as shown in (c) of FIG. 15 (S25).

However, if the acceleration measurement value exceeds the threshold A, the processing returns to S21. Even if the acceleration measurement value is smaller than or equal to the threshold A, when the angular velocity measurement value exceeds the threshold B within the time period Tω, the processing returns to S23.

As described above, the waveform obtainment unit 107 can obtain a measuring time waveform after a contact state of the probe to the node becomes stable, and the similarity calculation unit 108 can automatically start the similarity calculation. As a result, a similarity can be calculated with a high accuracy, thereby correctly determining a measuring point. In addition, the operator does not need to instruct start of similarity calculation after bringing the probe into contact with a target. Therefore, the measurement can be completed earlier.

Embodiment 3

Embodiment 3 differs from Embodiment 1 in that a measuring point for a potential or a current is determined in consideration of parasitic components in an electronic circuit. In the following description, the same structure as that of Embodiment 1 is not explained again.

Figure 16:
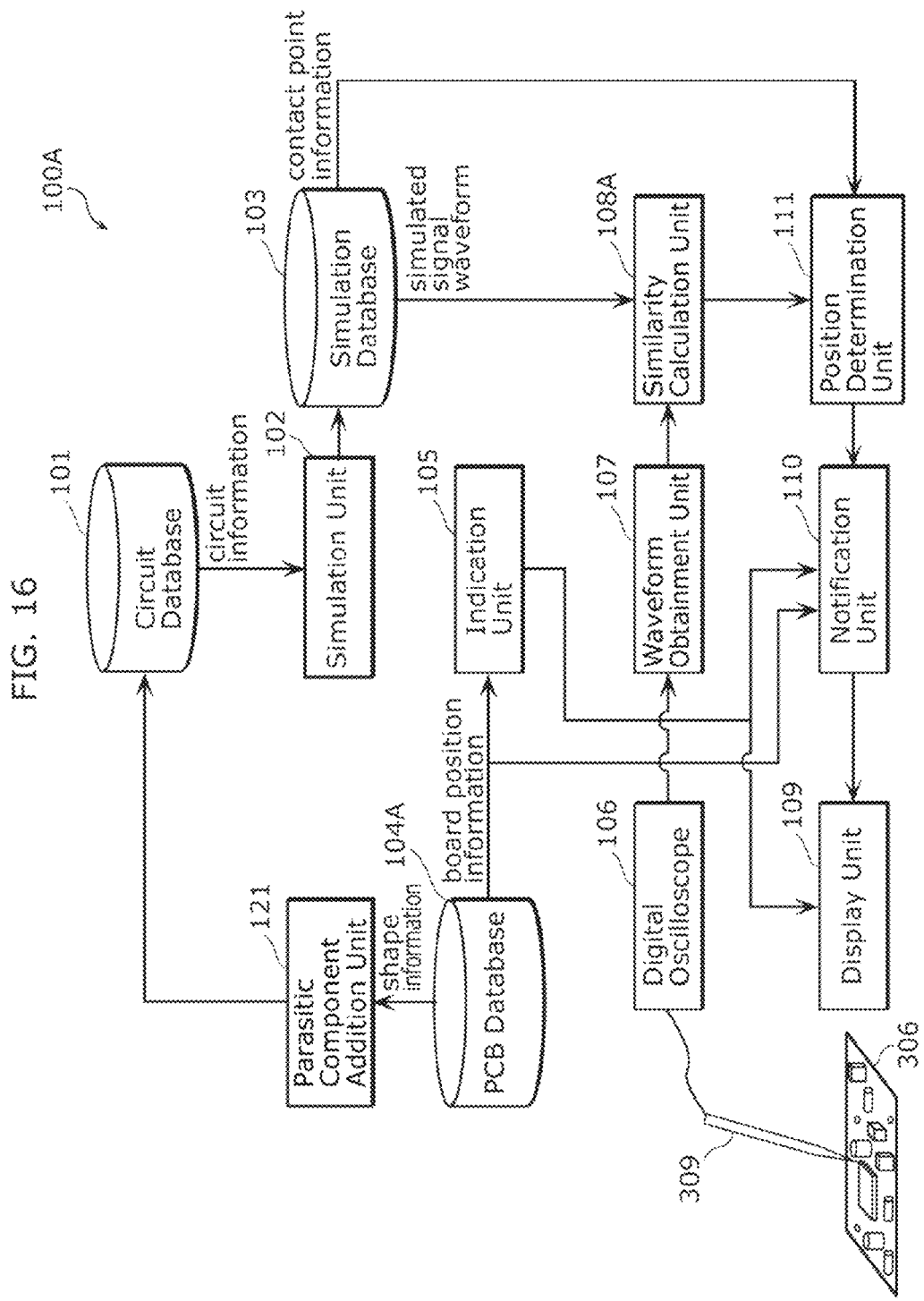
FIG. 16 is a block diagram showing a functional structure of an operation check support device according to Embodiment 3.

FIG. 16 is a block diagram showing a functional structure of an operation check support device according to Embodiment 3. The operation check support device 100A includes the circuit database 101, the simulation unit 102, the simulation database 103, a PCB database 104A, the indication unit 105, the digital oscilloscope 106, the waveform obtainment unit 107, a similarity calculation unit 108A, the display unit 109, the notification unit 110, the position determination unit 111, and a parasitic component addition unit 121.

<Use Scene>

Figure 17:
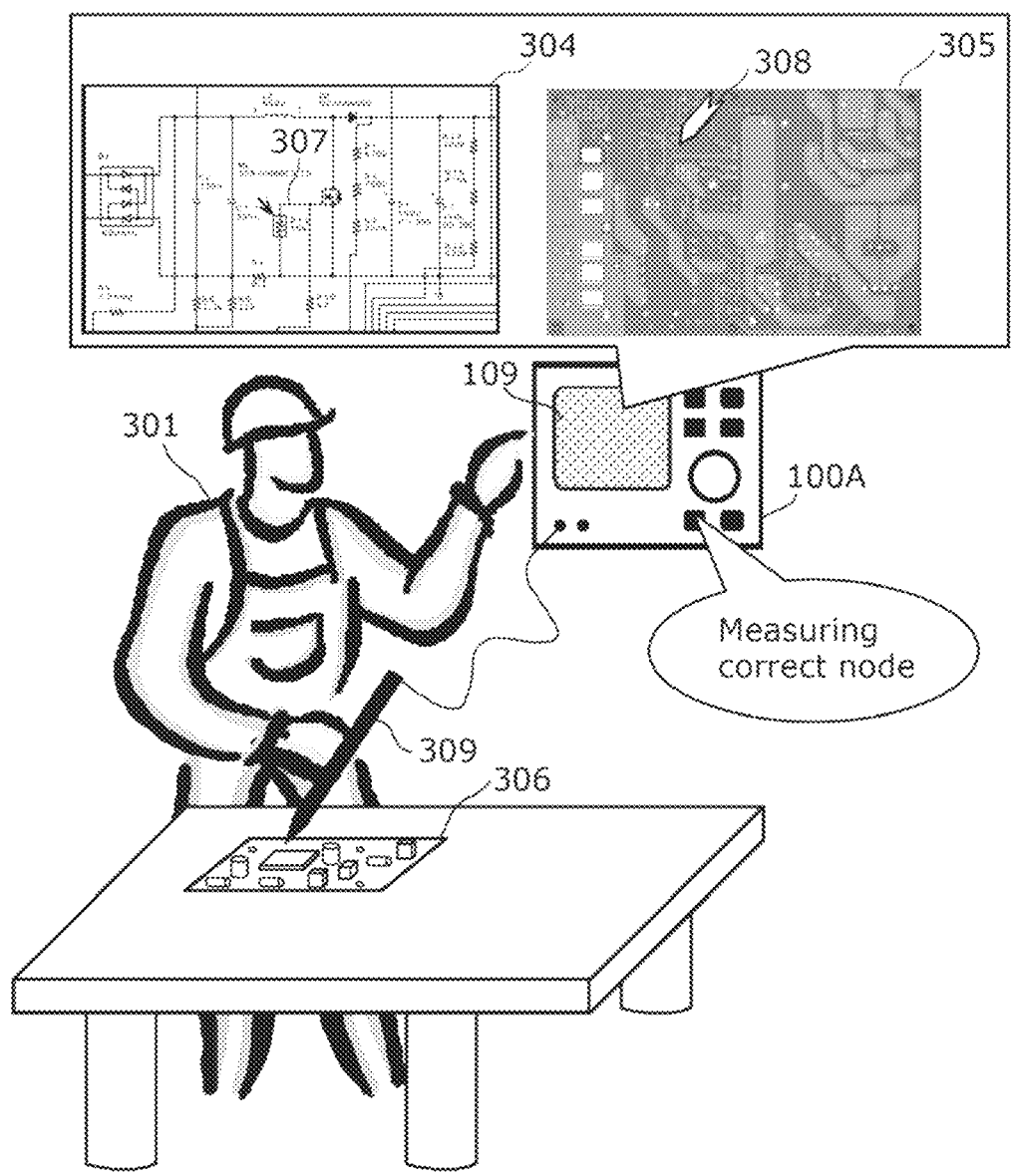
FIG. 17 is a diagram showing a use scene of the operation check support device according to Embodiment 3.

FIG. 17 shows a use scene of the operation check support device 100A according to the present embodiment. The display unit 109 displays: a circuit diagram 304 of a circuit mounted on a PCB 306; and a PCB layout 305. On the circuit diagram 304, the display unit 109 displays a position of a certain electronic part. On the PCB layout 305, the display unit 109 displays a position corresponding to the certain electronic part on the circuit diagram 304. For example, as shown in FIG. 17, a currently-measuring point may be shown by an arrow like a measuring point 308, by a different color like a measuring point 307, or by flashing. The display unit 109 performs displaying so that at least the operator 301 can determine one of a plurality of electronic parts displayed on the PCB layout 305.

The operator 301 actually measures a node voltage or the like of an electronic part on the PCB 306 with reference to the circuit diagram 304 and the PCB layout 305 which are displayed on the display unit 109. In more detail, the operator 301 measures a voltage or the like by bringing the probe 309 connected to the digital oscilloscope 106 in FIG. 16 into contact with a node of an electronic part on the PCB 306.

On the circuit diagram 304, the display unit 109 displays, as the measuring point 307, a point at which the operator 301 is to measure a voltage. On the PCB layout 305, the display unit 109 displays the same point as the measuring point 308. The operator 301 brings the tip of the probe 309 into contact with the measuring point on the PCB 306 corresponding to the measuring point 308, with reference to the measuring point 307 on the circuit diagram 304 and the measuring point 308 on the PCB layout 305.

Figure 18:
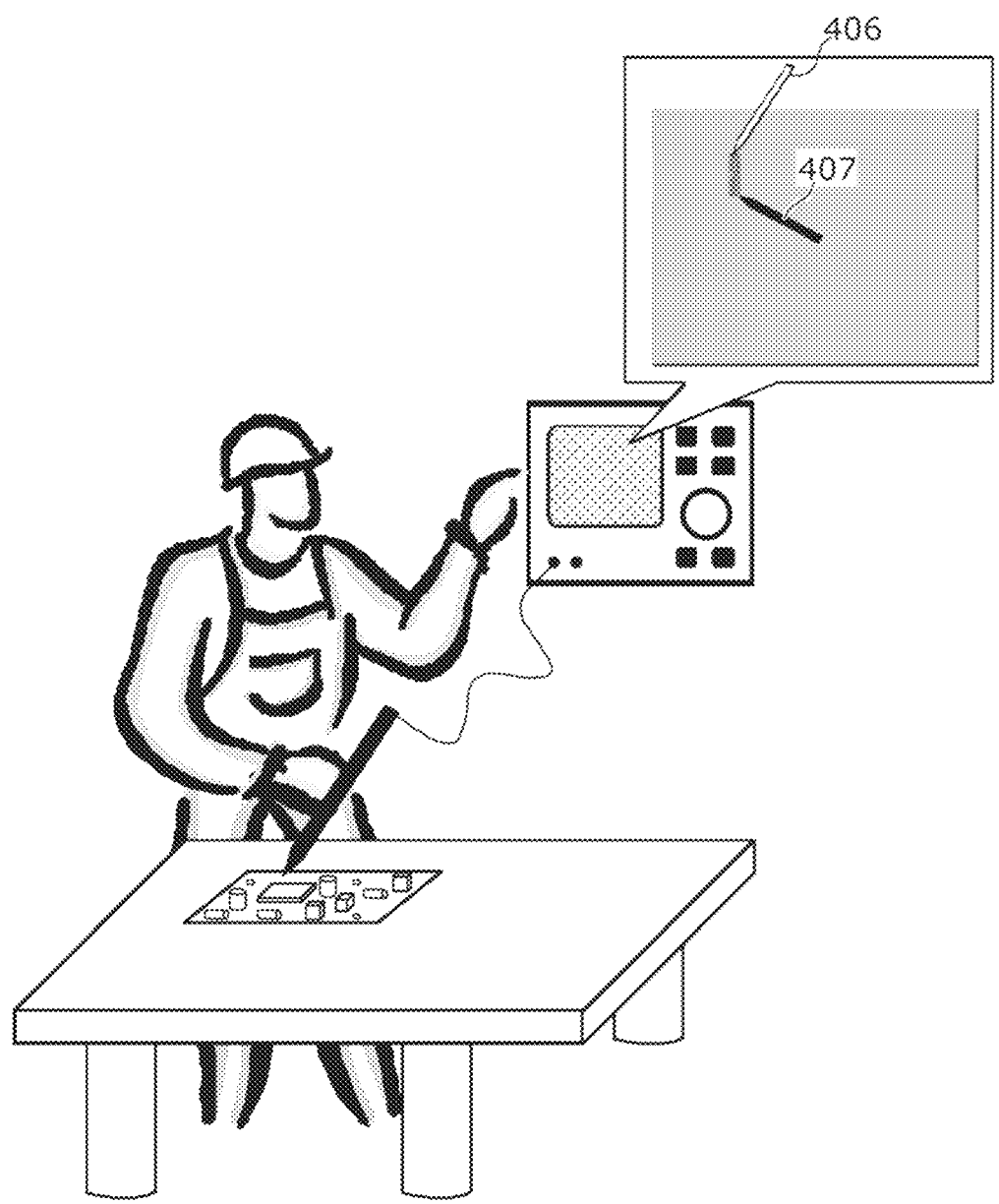
FIG. 18 is a diagram showing a use scene of the operation check support device according to Embodiment 3.

If the measuring point 308 on the PCB layout 305 matches the measuring point on the PCB 306 to which the operator 301 brings the tip of the probe 309 into contact, the notification unit 110 emits an audio message "measuring a correct node" to the operator 301. If the operator 301 is probing a wrong measuring point, the notification unit 110 may cause the display unit 109 to display a positional relationship between the currently-probing node (measuring point) and a node (measuring point) to be measured. For example, as shown in FIG. 18, the notification unit 110 may cause the display unit 109 to display a currently-probing node 406 and a to-be-measured node 407 by arrows, thereby showing a positional relationship between them.

<Construction>

The following describes different structural elements in the operation check support device 100A from those in the operation check support device 100 according to Embodiment 1.

The PCB database 104A stores pieces of shape information in addition to the board position information which the PCB database 104 according to Embodiment 1 stores. Each piece of shape information is information indicting a shape of a corresponding copper foil used in the PCB. The shape information includes group information (starting point coordinates, ending point coordinates, width, thickness) for each of copper foils. Plural pieces of such group information can express a copper foil having a complex shape. The shape information includes information required to calculate at least parasitic components in the PCB.

The parasitic component addition unit 121 calculates parasitic components of copper foils based on shape information stored in the PCB database 104A, and updates the circuit information stored in the circuit database 101. For example, the parasitic component addition unit 121 generates data of a parasitic component (hereinafter, the data is referred to simply as a "parasitic component") from the shape information of the copper foils, and adds the generated parasitic component data to the circuit information.

(a) and (b) of FIG. 19 show an example of the processing performed by the parasitic component addition unit 121. (a) of FIG. 19 shows two copper foils sandwiching a PCB having a relative permittivity $\epsilon$ and a thickness D [mm]. Each of the copper foils has a thickness d [mm], a width [mm], and a length l [mm]. These pieces of information are previously calculated as shape information for each PCB, and stored into the PCB database 104A.

In this case, the parasitic component addition unit 121 calculates parasitic components of a terminal 1 and a terminal 2 by using a known math formula (for example, Non-Patent Literature: "Transistor Technology (Toranzista Gijutsu)" magazine, CQ Publishing Col, Ltd., February, 1993). More specifically, as shown in (b) of FIG. 19, the parasitic component addition unit 121 calculates a parasitic component L (inductance parasitic component) and a parasitic component C (capacitance parasitic component) for the terminal 1 and the terminal 2. Here, $\epsilon 0$ is a permittivity in vacuum.

Figure 20:
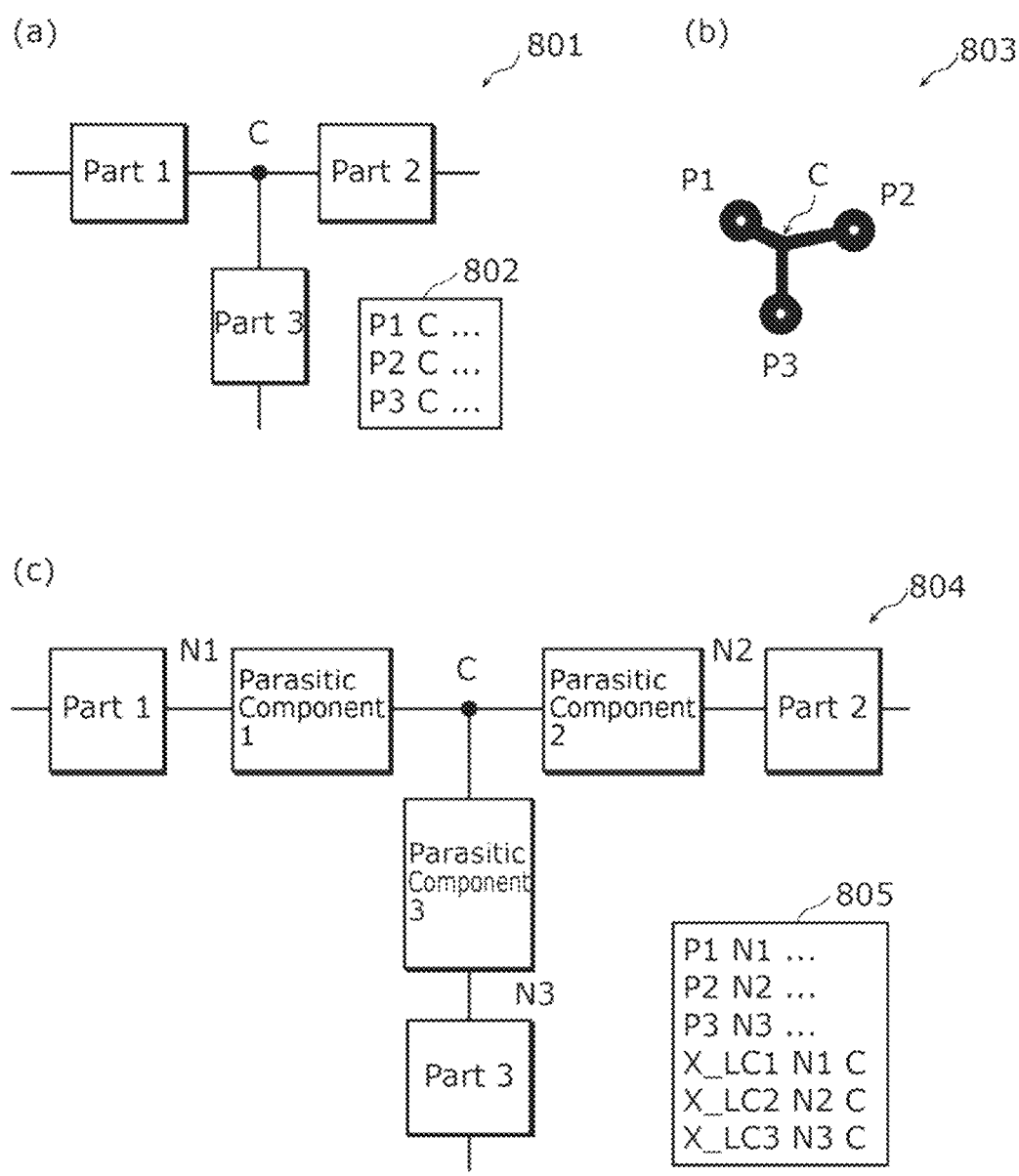
FIG. 20 is a diagram showing an example of parasitic components to be added by the parasitic component addition unit to the circuit database, according to Embodiment 3.

FIG. 20 shows an example of processing for adding the parasitic component to the circuit information. With reference to (a) of FIG. 20, the parasitic component addition unit 121 generates, for example, data of a parasitic component of a node C in a circuit 801 (netlist 802) in the circuit database 101. More specifically, the operator 301 searches the PCB database 104A for shape information of a copper foil of the node C, and thereby generates data of a parasitic component. (b) of FIG. 20 shows an example of the parasitic component 803.

With reference to (c) of FIG. 20, the parasitic component addition unit 121 adds the parasitic component 803 to the circuit 801 to generate a circuit 804. Accordingly, information (for example, a text) equivalent to the parasitic component 803 is inserted into the netlist 802 to generate a netlist 805. Here, in the netlist 805, X_LC1 to X_LC3 are LC circuits equivalent to parasitic components.

The simulation unit 102 simulates a signal waveform of each of the nodes included in the electronic circuit, based on the circuit information added with the parasitic component by the parasitic component addition unit 121. The technique for the simulation is the same as that used in the simulation unit 102 according to Embodiment 1.

The similarity calculation unit 108 calculates a similarity between a simulated signal waveform f_s_k(t) and a measured waveform f_r(t) for each k(k=1, . . . , n). The similarity calculation method will be described later.

The notification unit 110 performs displaying or audio outputting, based on the position of the node which is determined by the position determination unit 111, the position of the node on the electronic circuit which is indicated by the indication unit 105, and the board position information stored in the PCB database 104A.

For example, as shown in FIG. 17, if the node position determined by the position determination unit 111 matches the node position indicated by the indication unit 105, the notification unit 110 emits an audio message "measuring a correct node" to the operator 301. On the other hand, as shown in FIG. 18, if the operator 301 is probing an electronic part at a wrong node position and the position determination unit 111 detects the position, the notification unit 110 may cause the display unit 109 to display the currently-probing node 406 and a to-be-measured node 407 by arrows to show a positional relationship between them.

<Processing Flow>

Next, the flow of the processing performed by the operation check support device 100A is described.

Figure 21:
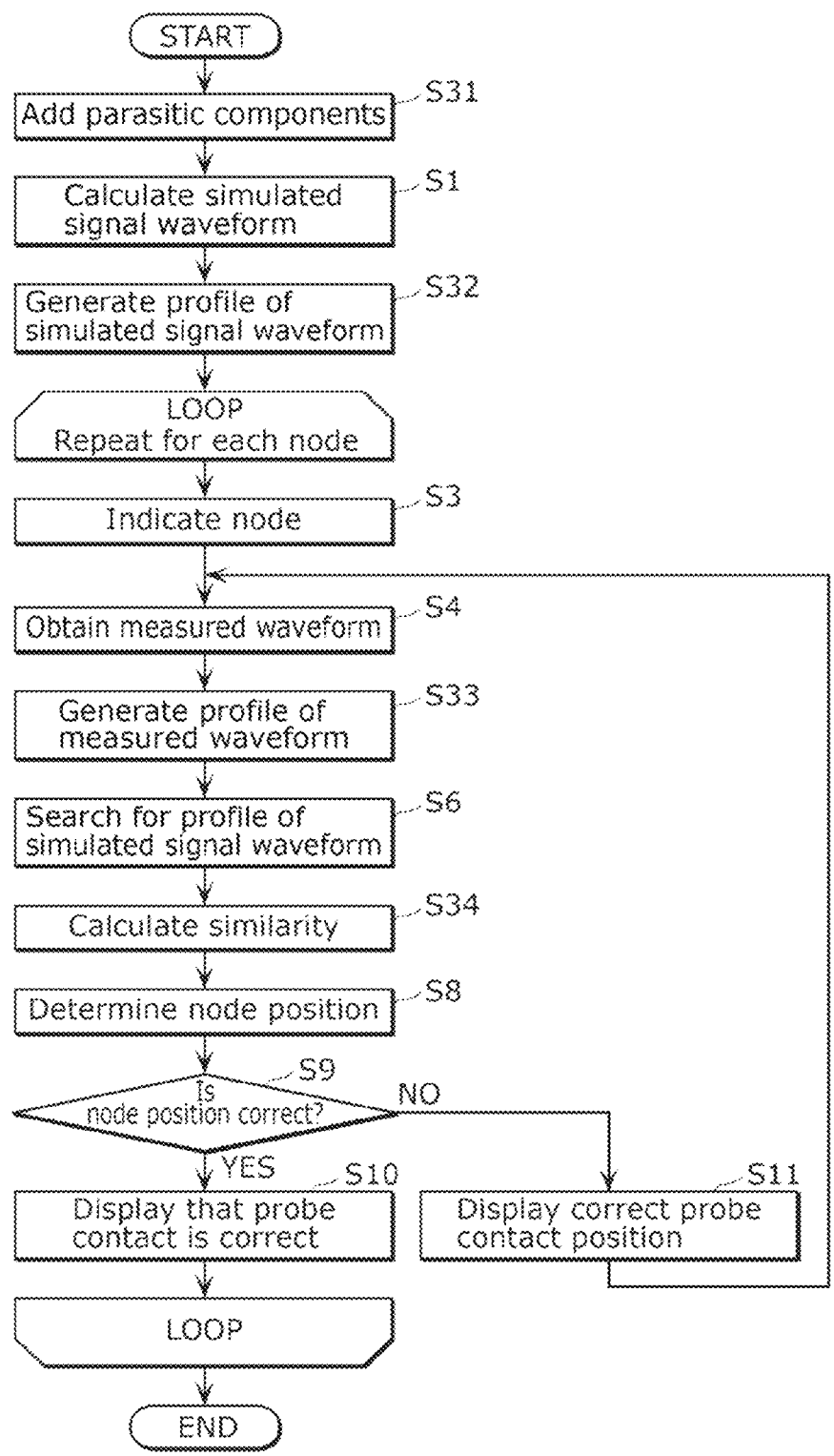
FIG. 21 is a flowchart of processing performed by the operation check support device according to Embodiment 3.

FIG. 21 is a flowchart of the processing performed by the operation check support device 100A. The following describes only steps different from the steps performed by the operation check support device 100 shown in FIG. 8. The steps identical to the steps performed by the operation check support device 100 are not described again.

The parasitic component addition unit 121 calculates a parasitic component of a copper foil based on the shape information stored in the PCB database 104A, and updates the circuit information stored in the circuit database 101 (S31). The details of the processing performed by the parasitic component addition unit 121 have previously been described. Therefore, the details are not described again below.

Figure 22:
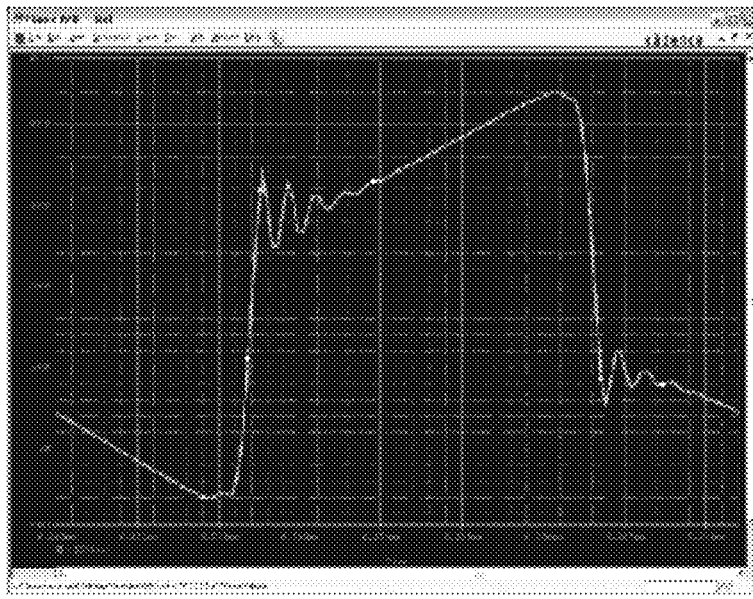
FIG. 22 is a diagram showing an example of a profile of a simulated signal waveform according to Embodiment 3.

The simulation unit 102 generates a profile including maximum and minimum values, a basic cycle, and a frequency property envelope for each of simulated signals (S32). For example, FIG. 22 shows a profile generated for the simulated signal waveform of the node 402. The maximum and minimum values and the basic cycle are the same as those of the profile shown in FIG. 9. The basic cycle waveform is obtained by extracting a signal waveform in a basic cycle from a simulated signal waveform.

Figure 23:
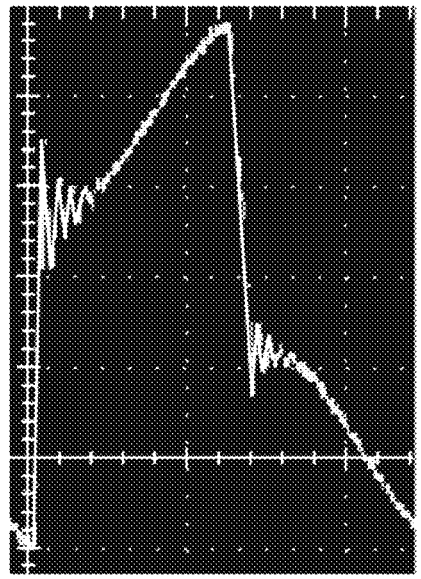
FIG. 23 is a diagram showing an example of a profile of a measured waveform according to Embodiment 3.

The waveform obtainment unit 107 performs the same processing as S32, thereby generating a profile of the measured waveform which is the same as the profile of the simulated signal waveform (S33). For example, FIG. 23 shows a profile generated for the measured waveform 701.

The similarity calculation unit 108A calculates a similarity between each of the simulated signal waveforms and the measured waveform, based on the profiles of the simulated signal waveforms extracted at S6 (S34). The similarity calculation unit 108A calculates a similarity between the simulated signal waveform f_s_k(t) and the measured waveform f_r(t), by using dynamic programming (in other words, a dynamic time warping).

FIG. 24 shows a known dynamic programming algorithm. By this algorithm, a similarity d_k(f_r(t), f_s_k(t)) between a measured waveform f_r(t) and a simulated signal waveform f_s_k(t) of a node k is obtained.

However, since the simulated signal waveform and the measured waveform have different intervals between discrete times as described previously, the similarity calculation unit 108A aligns the simulated signal waveform to have equal intervals of the measured waveform before calculating the similarity using the dynamic programming. The alignment method is the same as shown in FIG. 10.

In order to match respective comparing points between the simulated signal waveform and the measured waveform, the similarity calculation unit 108A calculates a time correlation between the simulated signal waveform and the measured waveform, and applies dynamic programming by using an offset time $t_{start}$ having a maximum time correlation as a starting point of the simulated signal waveform. The offset time $t_{start}$ is calculated by following Equation 2.

[Math. 2]

$$t_{start} = \Delta T \times \mathrm{argmax} \sum_i f_s(t_i - n\Delta T) f_r(t_i) \qquad \text{(Equation 2)}$$

Here, $f_s(t)$ represents a simulated signal waveform f_s_k(t), and $f_r(t)$ represents a measured waveform f_r(t). $\Delta T$ represents a sampling cycle.

More specifically, a similarity between a measured waveform f_r(t) and a simulated signal waveform f_s_k(t) of a node k is calculated as d_k(f_r(t–$t_{start}$), f_s_k(t)).

Figure 25:
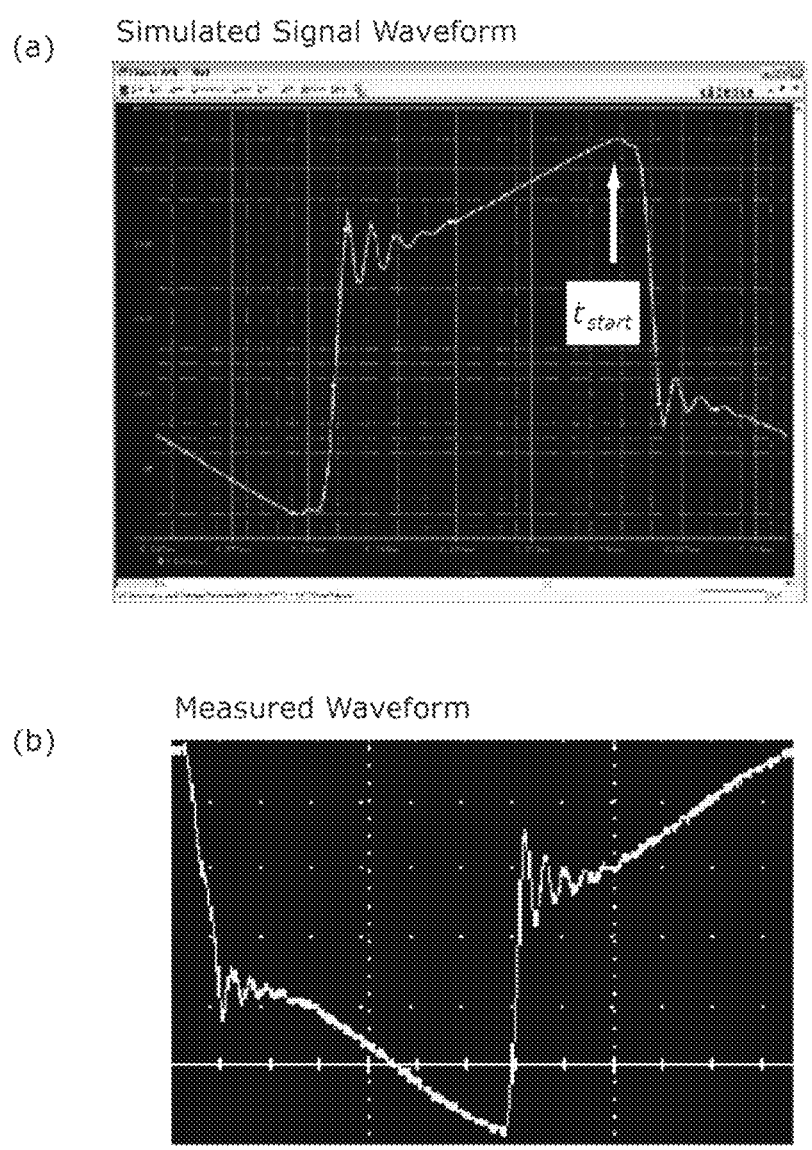
FIG. 25 is a diagram showing a method for calculating an offset time for a simulated signal waveform according to Embodiment 3.

Therefore, for example, as an offset time $t_{start}$ between the simulated signal waveform shown in (a) of FIG. 25 and the measured waveform shown in (b) of FIG. 25, an offset time $t_{start}$ of a time position shown in (a) of FIG. 25 is calculated.

According to the present embodiment, the operator can immediately notice whether or not a currently measuring node is a node to be measured, at a time of starting the proving of the node in consideration of parasitic components. Furthermore, if a wrong measuring point is measured, a positional relationship between the currently-measuring node and a node to be measured is presented. It is therefore possible to immediately start probing of the node to be measured, eventually shortening a time required for the measurement. In addition, since error measurements are not mixed, it is possible to prevent that such an error measurement causes the operator to return to a previous measurement step. The consideration of parasitic components allows accurate node position determination.

If parasitic components are mixed in a waveform, the waveform is likely to be irregular and to include high-frequency components. In this case, comparison of both waveforms in a time domain is more stable than comparison of both waveforms in a frequency domain.

It is also possible that, if a similarity between a simulated signal waveform f_s_k(t) and a measured waveform f_r(t) is greater than or equal to a predetermined threshold, the similarity calculation unit 108A determines that the operator 301 brings the probe 309 into contact with a correct electronic part. The same goes for the similarity calculation unit 108.

In addition, the parasitic component addition unit 121 may use the following method for calculating parasitic components. First, electromagnetic analysis such as Finite-difference time-domain (FDTD) is performed on shape information of a copper foil. Then, a LC lumped parameter circuit is fit for the resulting S parameter. As a result, data of a parasitic component can be generated with a high accuracy.

It should also be noted that, among the structural elements of the operation check support device 100 shown in FIG. 1, the waveform obtainment unit 107, the similarity calculation unit 108, the position determination unit 111, and the notification unit 110 are indispensable, and the other structural elements may not be included in the operation check support device 100.

It should also be noted that the similarity calculation unit 108A in Embodiment 3 may be used instead of the similarity calculation unit 108 in Embodiment 1, and the similarity calculation unit 108 in Embodiment 1 may be used instead of the similarity calculation unit 108A in Embodiment 3.

It should also be noted in each of the above-described embodiments that each of the structural elements may be implemented into a dedicated hardware or implemented by executing a software program appropriate for it. Each of the structural elements may be implemented, when a program executing unit, such as a CPU or a processor, reads and executes a software program recorded on a recording medium, such as a hard disk or a semiconductor memory. Here, the software for implementing the operation check support device according to each of the above-described embodiments is the following program.

A non-transitory computer-readable recording medium is for use in a computer. The recording medium has a computer program recorded thereon for causing the computer to execute the operation check support method. The operation check support method includes: obtaining a measured waveform that is a signal waveform of one of a voltage and a current, the measured waveform being measured by the operator bringing a probe into contact with the board; calculating a similarity between the measured waveform obtained in the obtaining and each of simulated signal waveforms, the each of simulated signal waveforms being a signal waveform of one of a voltage and a current at a corresponding one of nodes on the electronic circuit, and the each of simulated signal waveforms being obtained by simulating the operation of the electronic circuit; determining a position of a node among the nodes on the electronic circuit based on node information, the node corresponding to a simulated signal waveform having a maximum similarity calculated in the calculating, the node information indicating positions of the nodes on the electronic circuit, and the nodes each corresponding to a corresponding one of the simulated signal waveforms; and notifying the operator of the position of the node determined in the determining on the electronic circuit.

As described above, although operation check support devices according to one or more embodiments have been described, the present discloser is not limited to any one of the embodiments. Those skilled in the art will be readily appreciated that various modifications of the embodiments and combinations of the structural elements of the embodiments are possible without materially departing from the novel teachings and advantages of the present disclosure. Accordingly, all such modifications and combinations are intended to be included within the scope of the present disclosure.

For example, it is also possible to combine Embodiment 2 and Embodiment 3.

INDUSTRIAL APPLICABILITY

The present disclosure is useful as an operation check support device or the like that supports works for completing hardware design by Software In the Library Simulation (SILS) or the like, then manufacturing a few pieces of test hardware for checking their operations, and checking the operations, for example.

The invention claimed is:

1. An operation check support device that supports an operator in checking an operation of an electronic circuit mounted on a board, the operation check support device comprising:
a waveform obtainment unit configured to obtain a measured waveform that is a signal waveform of one of a voltage and a current, the measured waveform being measured by the operator bringing a probe into contact with the board;
a similarity calculation unit configured to calculate a similarity between the measured waveform obtained by the waveform obtainment unit and each of simulated signal waveforms, the each of simulated signal waveforms being a signal waveform of one of a voltage and a current at a corresponding one of nodes on the electronic circuit, and the each of simulated signal waveforms being obtained by simulating the operation of the electronic circuit;
a position determination unit configured to determine a position of a node among the nodes on the electronic circuit based on node information, the node corresponding to a simulated signal waveform having a maximum similarity calculated by the similarity calculation unit, the node information indicating positions of the nodes on the electronic circuit, and the nodes each corresponding to a corresponding one of the simulated signal waveforms; and
a notification unit configured to notify the operator of the position of the node on the electronic circuit as determined by the position determination unit.

2. The operation check support device according to claim 1 further comprising:
a parasitic component addition unit configured to (i) calculate a parasitic component on the board based on shape information of a copper foil used on the board, and (ii) add data of the calculated parasitic component into a netlist representing the electronic circuit; and
a simulation unit configured to simulate the operation of the electronic circuit based on the netlist added with the data by the parasitic component addition unit, to calculate the simulated signal waveforms,
wherein the similarity calculation unit is configured to calculate a similarity between the measured waveform obtained by the waveform obtainment unit and each of the simulated signal waveforms calculated by the simulation unit.

3. The operation check support device according to claim 2,
wherein the parasitic component addition unit is configured to (i) calculate an inductance parasitic component and a capacitance parasitic component of the copper foil based on the shape information, and (ii) add, to the netlist, data indicating the calculated inductance parasitic component and the calculated capacitance parasitic component of the copper foil as the data of the parasitic component, and
the simulation unit is configured to perform numerical analysis on a node equation of the netlist added with the data by the parasitic component addition unit, to calculate transient property of one of a voltage and a current at each of the nodes, thereby calculating the simulated signal waveforms.

4. The operation check support device according to claim 3,
wherein the shape information includes a thickness of the copper foil, a length of the copper foil, a width of the copper foil, a thickness of the board, and a permittivity of the board.

5. The operation check support device according to claim 1, further comprising
an indication unit configured to indicate, to the operator, (a) a position of a node on the electronic circuit and (b) a position on the board, the position of the node being a position at which one of a voltage and a current is to be measured, and the position on the board corresponding to the position of the node and being a position at which the board is to be in contact with the probe,
wherein the waveform obtainment unit is configured to obtain the measured waveform according to indication from the indication unit, the measured waveform being measured by the operator bringing the probe into contact with the board, and
the notification unit is further configured to (i), when the position of the node on the electronic circuit which is determined by the position determination unit is the position of the node on the electronic circuit which is indicated by the indication unit, cause a display unit to display that the operator is bringing the probe into contact with a correct position, and (ii), when the position of the node on the electronic circuit which is determined by the position determination unit is not the position of the node on the electronic circuit which is indicated by the indication unit, cause the display unit to display the position on the board with which the operator brings the probe into contact and the position of the board which corresponds to the node indicated by the indication unit, based on board position information indicating positions on the board each of which corresponds to a corresponding one of the nodes on the electronic circuit.

6. The operation check support device according to claim 1, wherein the similarity calculation unit is configured to compare the measured waveform obtained by the waveform obtainment unit to each of the simulated signal waveforms in a frequency domain using dynamic programming, to calculate the similarity between the measured waveform and each of the simulated signal waveforms.

7. The operation check support device according to claim 6, wherein the similarity calculation unit is configured to compare a frequency spectrum envelope of the measured waveform obtained by the waveform obtainment unit to a frequency spectrum envelope of each of the simulated signal waveforms by dynamic programming, to calculate the similarity between the measured waveform and each of the simulated signal waveforms.

8. The operation check support device according to claim 1, wherein the similarity calculation unit is configured to compare the measured waveform obtained by the waveform obtainment unit to each of the simulated signal waveforms in a time domain using dynamic programming, to calculate the similarity between the measured waveform and each of the simulated signal waveforms.

9. The operation check support device according to claim 1, wherein the probe includes an acceleration and angular velocity sensor which measures an acceleration and an angular velocity, and
the waveform obtainment unit is configured to obtain the measured waveform having: the acceleration that is smaller than or equal to a first threshold; and the angular velocity that is smaller than or equal to a second threshold, the acceleration and the angular velocity being measured by the acceleration and angular velocity sensor.

10. The operation check support device according to claim 9, wherein the waveform obtainment unit is configured to obtain the measured waveform having: the acceleration that has been smaller than or equal to the first threshold for a first time period or more; and the angular velocity that has been smaller than or equal to the second threshold for a second time period or more after the first time period, the acceleration and the angular velocity being measured by the acceleration and angular velocity sensor.

11. An operation check support device that supports an operator in checking an operation of an electronic circuit mounted on a board, the operation check support device comprising:
an indication unit configured to indicate, to the operator, (a) a position of a node on the electronic circuit and (b) a position on the board, the position of the node being a position at which one of a voltage and a current is to be measured, and the position on the board corresponding to the position of the node and being to be in contact with a probe;
a waveform obtainment unit configured to obtain a measured waveform according to the indication from the indication unit, the measured waveform being a signal waveform of one of a voltage and a current, and the measured waveform being measured by the operator bringing the probe into contact with the board;
a similarity calculation unit configured to calculate a similarity between the measured waveform obtained by the waveform obtainment unit and each of simulated signal waveforms, the each of simulated signal waveforms being a signal waveform of one of a voltage and a current at a corresponding one of nodes on the electronic circuit, and the each of simulated signal waveforms being obtained by simulating the operation of the electronic circuit;
a position determination unit configured to determine a position of a node among the nodes on the electronic circuit based on node information, the node corresponding to a simulated signal waveform having a maximum similarity calculated by the similarity calculation unit, the node information indicating positions of the nodes on the electronic circuit, and the nodes each corresponding to a corresponding one of the simulated signal waveforms; and
the notification unit configured to (i), when the position of the node on the electronic circuit which is determined by the position determination unit is the position of the node on the electronic circuit which is indicated by the indication unit, cause a display unit to display that the operator brings the probe into contact with a correct position, and (ii), when the position of the node on the electronic circuit which is determined by the position determination unit is not the position of the node on the electronic circuit which is indicated by the indication unit, cause the display unit to display the position on the board with which the operator brings the probe into contact and the position of the board which corresponds to the node indicated by the indication unit, based on board position information indicating positions on the board each of which corresponds to a corresponding one of the nodes on the electronic circuit.

12. An operation check support method of supporting an operator by a computer to check an operation of an electronic circuit mounted on a board, the operation check support method comprising:
obtaining a measured waveform that is a signal waveform of one of a voltage and a current, the measured waveform being measured by the operator bringing a probe into contact with the board;
calculating a similarity between the measured waveform obtained in the obtaining and each of simulated signal waveforms, the each of simulated signal waveforms being a signal waveform of one of a voltage and a current at a corresponding one of nodes on the electronic circuit, and the each of simulated signal waveforms being obtained by simulating the operation of the electronic circuit;
determining a position of a node among the nodes on the electronic circuit based on node information, the node corresponding to a simulated signal waveform having a maximum similarity calculated in the calculating, the node information indicating positions of the nodes on the electronic circuit, and the nodes each corresponding to a corresponding one of the simulated signal waveforms; and
notifying the operator of the position of the node determined in the determining on the electronic circuit.

13. A non-transitory computer-readable recording medium for use in a computer, the recording medium having a computer program recorded thereon for causing the computer to execute the operation check support method according to claim 12.

* * * * *